(12) United States Patent
Shin et al.

(10) Patent No.: US 12,144,219 B2
(45) Date of Patent: Nov. 12, 2024

(54) TILED DISPLAY

(71) Applicant: Samsung Display Co., Ltd., Yongin-si (KR)

(72) Inventors: Dong Hee Shin, Anyang-si (KR); Byoung Sun Na, Seoul (KR); Yong Hee Lee, Suwon-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 396 days.

(21) Appl. No.: 17/465,774

(22) Filed: Sep. 2, 2021

(65) Prior Publication Data

US 2022/0115495 A1    Apr. 14, 2022

(30) Foreign Application Priority Data

Oct. 14, 2020  (KR) .................. 10-2020-0132508

(51) Int. Cl.
*H10K 59/18* (2023.01)
*H10K 50/84* (2023.01)
(Continued)

(52) U.S. Cl.
CPC ........... *H10K 59/18* (2023.02); *H10K 50/841* (2023.02); *H10K 59/12* (2023.02); *H10K 59/38* (2023.02)

(58) Field of Classification Search
CPC ...... H10K 59/18; H10K 50/841; H10K 59/38; H10K 59/12; H10K 2102/311;
(Continued)

(56) References Cited

U.S. PATENT DOCUMENTS 9,477,109 B2  10/2016  Huh et al.
9,575,241 B2   2/2017  Park
(Continued)

FOREIGN PATENT DOCUMENTS

JP    2018-190702   11/2018
KR    10-1434448     8/2014
(Continued)

OTHER PUBLICATIONS

Yin Maojun et al: "Color-stable WRGB emission from blue OLEDs with quantum dots-based patterned down-conversion layer", Organic Electronics vol. 62, Nov. 2018, pp. 407-411.
(Continued)

*Primary Examiner* — Chad M Dicke
*Assistant Examiner* — Jeremy Daniel Watts
(74) *Attorney, Agent, or Firm* — KILE PARK REED & HOUTTEMAN PLLC

(57) ABSTRACT

A tiled display includes: first and second display devices disposed adjacent to each other, the first and second display devices including display areas each having light-emitting areas, and a seam between adjacent ones of the display areas. Each of the first and second display devices includes: a first base part in the display areas, a first support layer on the first base part in the display areas and the seam, a display layer on the first support layer in the display areas and the seam, a second support layer on the display layer in the display areas and the seam, and a second base part on the second support layer in the display areas. The first support layer of the second display device is disposed on the second support layer of the first display device in the seam.

9 Claims, 16 Drawing Sheets

(51) Int. Cl.
  *H10K 59/12* (2023.01)
  *H10K 59/38* (2023.01)
(58) Field of Classification Search
  CPC .... H10K 77/111; H10K 59/19; Y02E 10/549;
  H01L 25/0753; H01L 25/167; H01L
  27/1214; H01L 25/00; H01L 33/62; H01L
  27/3293; H01L 27/3267; G02B 5/201;
  G09G 2300/026; G09G 3/32; G09G
  3/3208; G09G 2360/04; G09G 3/03;
  G09F 9/33; G09F 9/335; G09F 9/3023;
  G09F 9/3026; G06F 3/1446; G02F
  1/13336; Y10S 345/903
  See application file for complete search history.

(56) References Cited

U.S. PATENT DOCUMENTS

| | | | |
|---|---|---|---|
| 10,622,334 B2* | 4/2020 | Nakamura | H10K 59/18 |
| 10,768,883 B2 | 9/2020 | Jeong | |
| 2011/0057861 A1 | 3/2011 | Cok et al. | |
| 2016/0014882 A1 | 1/2016 | Jongman et al. | |
| 2016/0274623 A1* | 9/2016 | Yamazaki | G02F 1/133305 |
| 2017/0031643 A1* | 2/2017 | Jeong | G06F 1/1647 |
| 2017/0032763 A1* | 2/2017 | Cheong | G02F 1/13336 |
| 2019/0305073 A1 | 10/2019 | Chen et al. | |
| 2020/0168697 A1* | 5/2020 | Jang | H01L 27/156 |
| 2020/0211929 A1* | 7/2020 | Son | G09F 9/3026 |
| 2021/0083040 A1* | 3/2021 | Tang | H10K 71/00 |
| 2021/0132766 A1* | 5/2021 | Lee | G06F 3/04164 |
| 2021/0407974 A1* | 12/2021 | Jiang | H10K 59/18 |

FOREIGN PATENT DOCUMENTS

| | | |
|---|---|---|
| KR | 10-2015-0129156 | 11/2015 |
| KR | 10-2016-0099999 | 8/2016 |
| KR | 10-2017-0015773 | 2/2017 |

OTHER PUBLICATIONS

Search Report dated Mar. 18, 2022 issued to European Patent Application No. 21202666.0.

* cited by examiner

FIG. 8
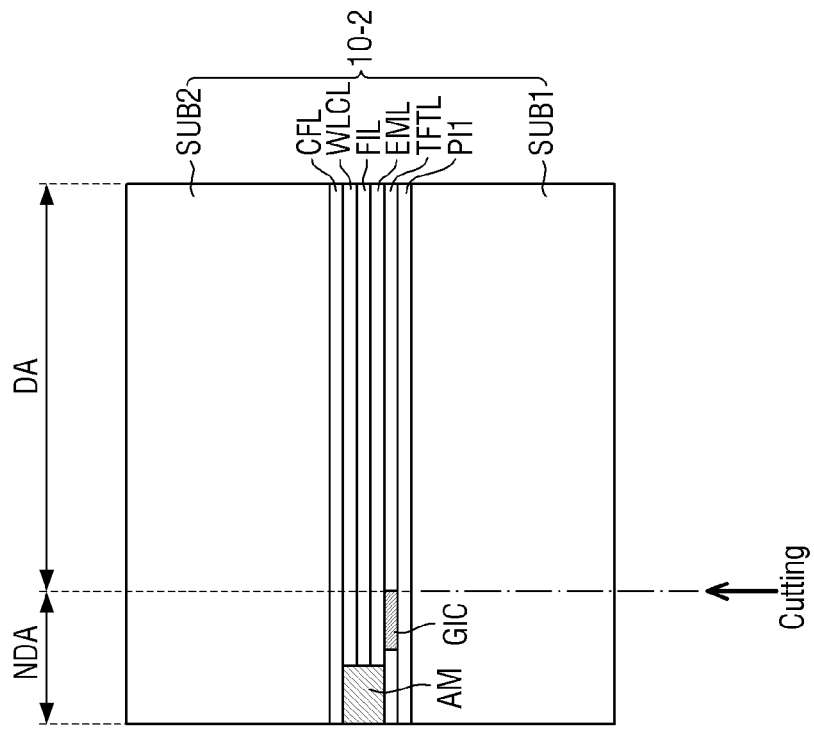
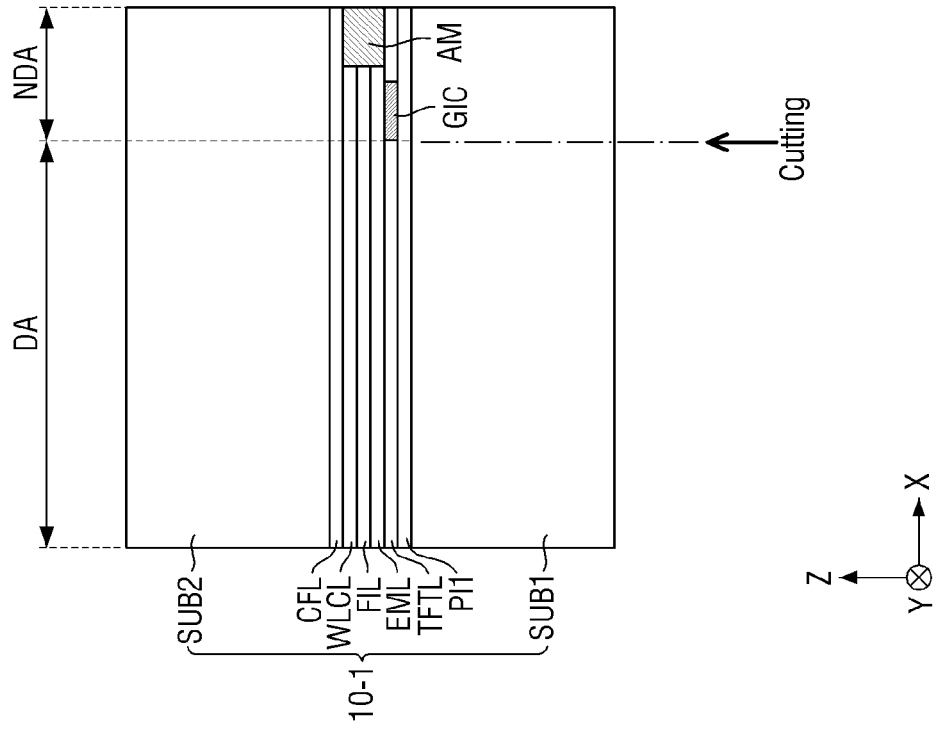

FIG. 9
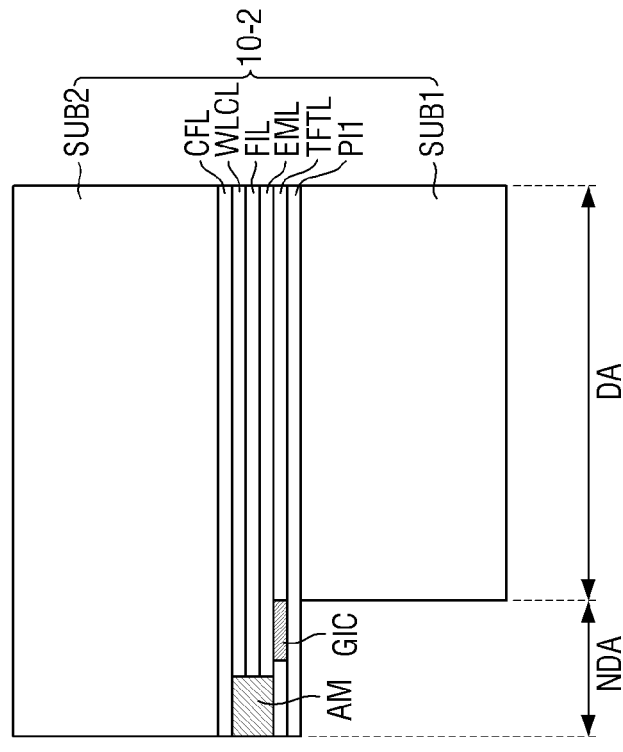
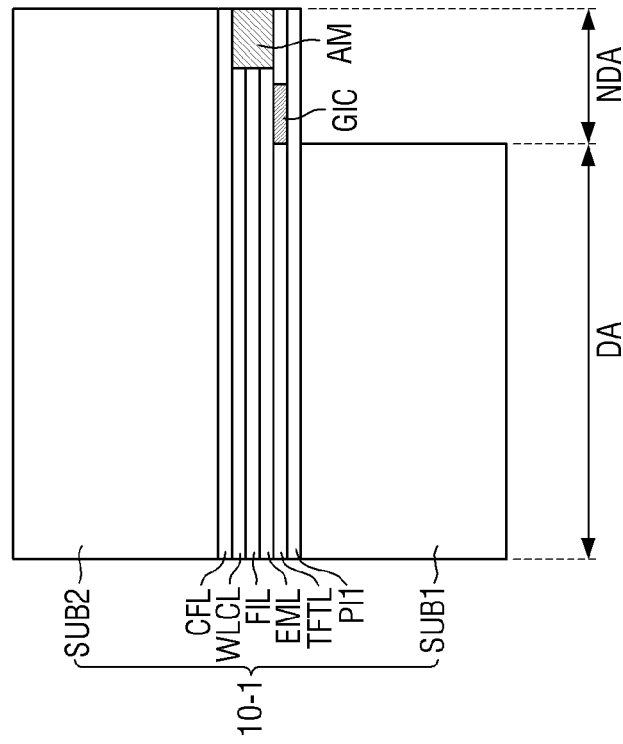

TILED DISPLAY

CROSS REFERENCE TO RELATED APPLICATION

This application claims priority from and the benefit of Korean Patent Application No. 10-2020-0132508 filed on Oct. 14, 2020, which is hereby incorporated by reference for all purposes as if fully set forth herein.

BACKGROUND

Field

Embodiments/implementations of the invention relate generally to a tiled display.

Discussion of the Background

As the modern day information-oriented society evolves, various demands for display devices are ever increasing. For example, display devices are being employed by a variety of electronic devices such as smart phones, digital cameras, laptop computers, navigation devices, and smart televisions. Display devices may be flat panel display devices such as a liquid-crystal display device, a field emission display device, and an organic light-emitting display device. Among such flat panel display devices, a light-emitting display device includes a light-emitting element that can emit light on its own, so that each of the pixels of the display panel can emit light by themselves. Accordingly, a light-emitting display device can display images without a backlight unit that supplies light to the display panel.

For a display device having a large screen, a great amount of pixels are disposed on the screen, and thus the defect rate of light-emitting elements may increase while productivity or reliability may deteriorate. To overcome such issues, a tiled display can provide a large screen by connecting a plurality of display devices having a relatively small size. Such a tiled display may include boundaries between the plurality of display devices that are referred to as seams because there are non-display areas or bezel areas between the plurality of display devices adjacent to each other. When a single image is displayed on the full screen, such boundaries between the display devices result in visible seams, hindering a viewer from getting immersed into the image and thereby causing a problem in that a not-so-realistic image is provided to the user.

The above information disclosed in this Background section is only for understanding of the background of the inventive concepts, and, therefore, it may contain information that does not constitute prior art.

SUMMARY

Aspects of the present disclosure provide a tiled display that eliminates visible seams between a plurality of display devices by way of preventing the boundaries or non-display areas between the display devices from being recognized, allowing a viewer to get immersed in displayed images without being hindered by unsightly boundaries between portions of an image.

It should be noted that aspects of the present disclosure are not limited to the above-mentioned aspects; and other objects of the present disclosure will be apparent to those skilled in the art from the following descriptions.

According to an embodiment, a tiled display includes first and second display devices disposed adjacent to each other, the first and second display devices each including a display area having light-emitting areas, and a seam between adjacent ones of the display areas. Each of the first and second display devices includes: a first base part in the display areas, a first support layer on the first base part in the display area and the seam, a display layer on the first support layer in the display area and the seam, a second support layer on the display layer in the display area and the seam, and a second base part on the second support layer in the display area. The first support layer of the second display device is disposed on the second support layer of the first display device in the seam.

The tiled display may further include an adhesive film attaching a lower surface of the first support layer of the second display device to an upper surface of the second support layer of the first display device in the seam.

A side surface of the first support layer or a side surface of the second support layer of the first display device may be in contact with a side surface of the first base part of the second display device.

A side surface of the first support layer or a side surface of the second support layer of the second display device may be in contact with a side surface of the second base part of the first display device.

The display layer may include: a thin-film transistor layer on the first support layer and including a plurality of thin-film transistors, a light emitting element layer on the thin-film transistor layer and including a plurality of light-emitting elements, a wavelength conversion layer on the light emitting element layer and including wavelength-converting units corresponding to the light-emitting areas, respectively, and a color filter layer on the wavelength conversion layer and including color filters corresponding to the light-emitting areas, respectively.

The display layer may further include: a filler layer between the light emitting element layer and the wavelength conversion layer, and a sealing member in the seam and surrounding the filler layer on a plane.

The sealing member of the first display device may face a side surface of the first base part of the second display device. The sealing member of the second display device may face a side surface of the second base part of the first display device.

The display layer may be disposed on the thin-film transistor layer in the seam, and wherein the tiled display further includes a gate driver electrically connected to the plurality of thin-film transistors in the display areas.

Each of the first and second base parts may include a glass material. Each of the first and second support layers may include polyimide (PI).

A thickness of the first base part or the second base part may be greater than a thickness of the display layer.

According to an embodiment, a tiled display includes first and second display devices disposed adjacent to each other, the first and second display devices each including a display area having light-emitting areas, and a seam between adjacent ones of the display areas. Each of the first and second display devices includes: a first base part in the display area, a first support layer on the first base part in the display area and the seam, a display layer on the first support layer in the display area and the seam, and a second base part disposed on the display layer in the display area and the seam. The first support layer of the first display device is disposed on the second base part of the second display device in the seam.

The tiled display may further include an adhesive film attaching a lower surface of the first support layer of the first display device to an upper surface of the second base part of the second display device in the seam.

Each of the display layer of the first display device and the display layer of the second display device may overlap the adhesive film in a thickness direction in the seam.

A side surface of the first base part of the first display device may be in contact with a side surface of the second base part of the second display device.

According to an embodiment, a display device includes first and second display devices comprising first and second display areas, respectively, each having light-emitting areas, and a seam between the first and second display areas. The first display device includes: a first base part in the first display area, a first support layer on the first base part in the first display area and the seam, and a display layer on the first support layer in the first display area and the seam. The second display device includes: a first base part in the second display area and in the seam, a first support layer on the first base part in the second display area and the seam, and a display layer on the first support layer in the second display area and the seam.

The first display device may further include: a second support layer on the display layer in the first display area and the seam, and a second base part on the second support layer in the first display area and the seam. The second display device further includes: a second support layer on the display layer in the second display area and the seam, and a second base part on the second support layer in the second display area.

The first support layer of the first display device may be disposed on the second support layer of the second display device in the seam.

A side surface of the first support layer or a side surface of the second support layer of the first display device may be in contact with a side surface of the second base part of the second display device.

A side surface of the first support layer or a side surface of the second support layer of the second display device may be in contact with a side surface of the first base part of the first display device.

A side surface of the first base part of the first display device may be in contact with a side surface of the first base part of the second display device. A side surface of the second base part of the first display device may be in contact with a side surface of the second base part of the second display device.

According to one or more embodiments, non-display areas of adjacent display devices of a tiled display overlap each other in seams between display areas, so that the space between the display devices can be reduced. Accordingly, the tiled display can allow a viewer to get immersed into the images by eliminating visual seams between the display devices by way of preventing the boundaries or seams between the display devices from being perceived by the viewer.

It should be noted that effects of the present disclosure are not limited to those described above and other effects of the present disclosure will be apparent to those skilled in the art from the following descriptions.

Additional features of the inventive concepts will be set forth in the description which follows, and in part will be apparent from the description, or may be learned by practice of the inventive concepts.

It is to be understood that both the foregoing general description and the following detailed description are illustrative and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the inventive concepts.

FIGS. 8 and 9 are cross-sectional views showing processes of fabricating the tiled display of FIG. 7.

DETAILED DESCRIPTION

Figure 1:
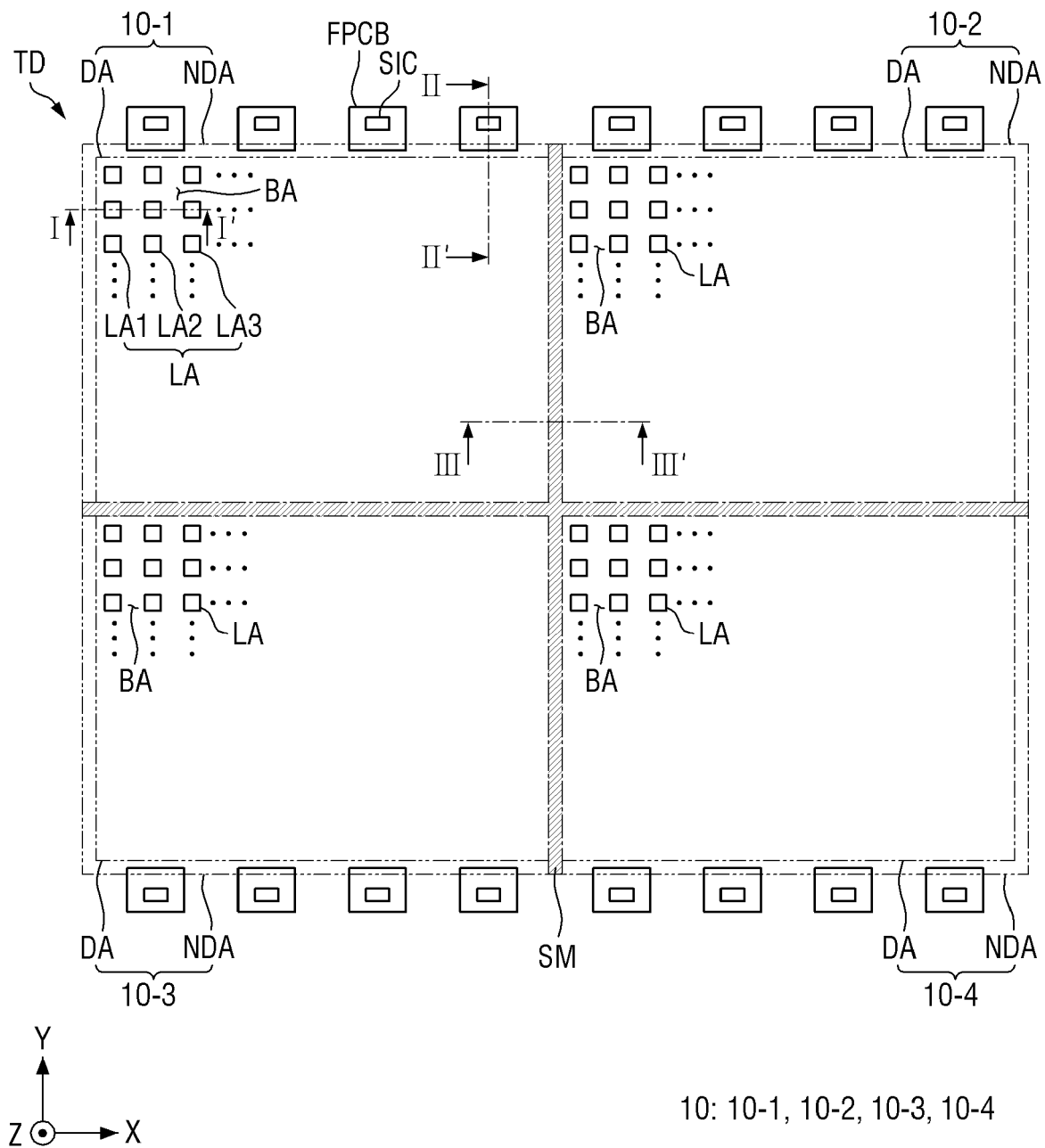
FIG. 1 is a plan view showing a tiled display according to an embodiment that has been constructed according to principles of the invention.

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods employing one or more of the inventive concepts disclosed herein. It is apparent, however, that various embodiments may be practiced without these specific details or with one or more equivalent arrangements. In other instances, well-known structures and devices are shown in block diagram form in order to avoid unnecessarily obscuring various embodiments. Further, various embodiments may be different, but do not have to be exclusive. For example, specific shapes, configurations, and characteristics of an embodiment may be used or implemented in another embodiment without departing from the inventive concepts.

Unless otherwise specified, the illustrated embodiments are to be understood as providing features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of idealized illustrative embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

FIG. 1 is a plan view showing a tiled display according to an embodiment that has been constructed according to principles of the invention.

Referring to FIG. 1, a tiled display TD may include a plurality of display devices 10. The plurality of display devices 10 may be arranged in, but is not limited to, a lattice pattern. The plurality of display devices 10 may be connected in a first direction (x-axis direction) or a second direction (y-axis direction), and the tiled display TD may have a certain shape. For example, the plurality of display devices 10 may all have the same size. It is, however, to be understood that the embodiment described herein is not limited thereto. For another example, the plurality of display devices 10 may have different sizes (i.e., display device 10-1 may have a different size than display device 10-2 in FIG. 1).

Each of the plurality of display devices 10 may have a rectangular shape including longer sides and shorter sides. The display devices 10 may be arranged such that the longer sides or the shorter sides of the display devices 10 are connected with one another. Some of the display devices 10 may be disposed on an edge of the tiled display TD to form one side of the tiled display TD. Some others of the display devices 10 may be disposed at a corner of the tiled display TD, and may form two adjacent sides of the tiled display TD. Still some others of the display devices 10 may be disposed on the inner side of the tiled display TD and may be surrounded by the other display devices 10.

Each of the display devices 10 may include a display area DA and a non-display area NDA. The display area DA may include a plurality of pixels to display images. The non-display area NDA may be disposed around the display area DA to surround the display area DA, and may not display an image.

The tiled display TD may have, but is not limited to, a generally planar shape. The tiled display TD may have a three-dimensional shape, giving a viewer a three-dimensional experience. For example, when the tiled display TD has a three-dimensional shape, at least some of the display devices 10 may have a curved shape. For another example, the display devices 10 may have a flat shape and are connected with one another at a predetermined angle, so that the tiled display TD may have a three-dimensional shape.

The tiled display TD may include seams SM located between the plurality of display areas DA. The tiled display TD may be formed by connecting non-display areas NDA of the adjacent display devices 10 with one another. The plurality of display devices 10 may be connected with one another through coupling members or adhesive members. The non-display areas NDA of the adjacent display devices 10 may overlap each other in the thickness direction (or the z-axis direction) in each of the seams SM. Accordingly, the display areas DA of the display devices 10 may be so close to each other that the seams SM therebetween are not recognized by a viewer. The reflectance of external light at the display areas DA of the plurality of display devices 10 may be substantially equal to the reflectance of external light at the seams SM between the display devices 10. Accordingly, it is possible to prevent the seams SM between the display devices 10 of the tiled display TD from being recognized by a viewer, thereby eliminating visible seams and allowing the viewer to get immersed into the displayed images without being hindered by an unsightly seam between adjacent display areas (i.e., between display device 10-1 and display device 10-2).

The tiled display TD may include first to fourth display devices 10-1 to 10-4. The number and coupling relationship of the display devices 10 are not limited by the embodiment of FIG. 1. The number of the display devices 10 may be determined depending on the sizes of the display devices 10 and the tiled display TD.

Each of the display devices 10 may include a plurality of pixels arranged in rows and columns in the display area DA. Each of the plurality of pixels may include a light-emitting area LA defined by a pixel-defining layer or a bank, and may emit light having a peak wavelength through the light-emitting area LA. For example, the display area DA of each of the display devices 10 may include first to third light-emitting areas LA1, LA2 and LA3. In each of the first to third light-emitting areas LA1, LA2 and LA3, light generated by light-emitting elements of the display devices 10 exits out of the display devices 10.

The first to third light-emitting areas LA1, LA2 and LA3 may emit light having predetermined peak wavelengths to the outside of the display devices 10. The first light-emitting area LA1 may emit light of a first color, the second light-emitting area LA2 may emit light of a second color, and the third light-emitting area LA3 may emit light of a third color. For example, the light of the first color may be red light having a peak wavelength in the range of 610 to 650 nm, the light of the second color may be green light having a peak wavelength in the range of 510 to 550 nm, and the light of the third color may be blue light having a peak wavelength in the range of 440 to 480 nm. It is, however, to be understood that the embodiment described herein is not limited thereto.

The first to third light-emitting areas LA1, LA2, and LA3 may be arranged repeatedly and sequentially along the first direction (X-axis direction) of the display area DA. For example, the area of the first emission area LA1 may be larger than the area of the second emission area LA2, and the area of the second emission area LA2 may be larger than the area of the third emission area LA3. For another example, the area of the first emission area LA1, the area of the second emission area LA2 and the area of the third emission area LA3 may be substantially all of equal size.

The display areas DA of the display devices 10 may include light-blocking areas BA surrounding the plurality of light-emitting areas LA. The light-blocking areas BA can prevent a mixture of lights of different colors emitted from the first to third light-emitting areas LA1, LA2 and LA3.

Flexible films FPCB may be disposed in the non-display area NDA of each of the display devices 10. The flexible films FPCB may be attached to pads disposed on a base part of each of the plurality of display devices 10. One sides of the flexible films FPCB may be connected to the pads, while the other sides of the flexible films FPCB may be connected to source circuit boards (not shown). The flexible films FPCB may transmit signals from source drivers SIC to the display devices 10.

The source drivers SIC may be disposed on the flexible films FPCB, respectively, and may be connected to a plurality of pixels of the display devices 10. For example, the source drivers SIC may be integrated circuits (ICs). The source drivers SIC may convert digital video data into analog data voltage based on a source control signal from a timing controller, and may supply it to data lines of the display areas DA through the flexible films FPCB.

The flexible films FPCB may be disposed on the non-display areas NDA disposed along the edges of the tiled display TD. For example, the flexible films FPCB may be disposed on the upper side of the non-display areas NDA of the first display device 10-1 and the second display device 10-2, and on the lower side of the non-display areas NDA of the third display device 10-3 and the fourth display device 10-4. It is, however, to be understood that the embodiment described herein is not limited thereto.

Figure 2:
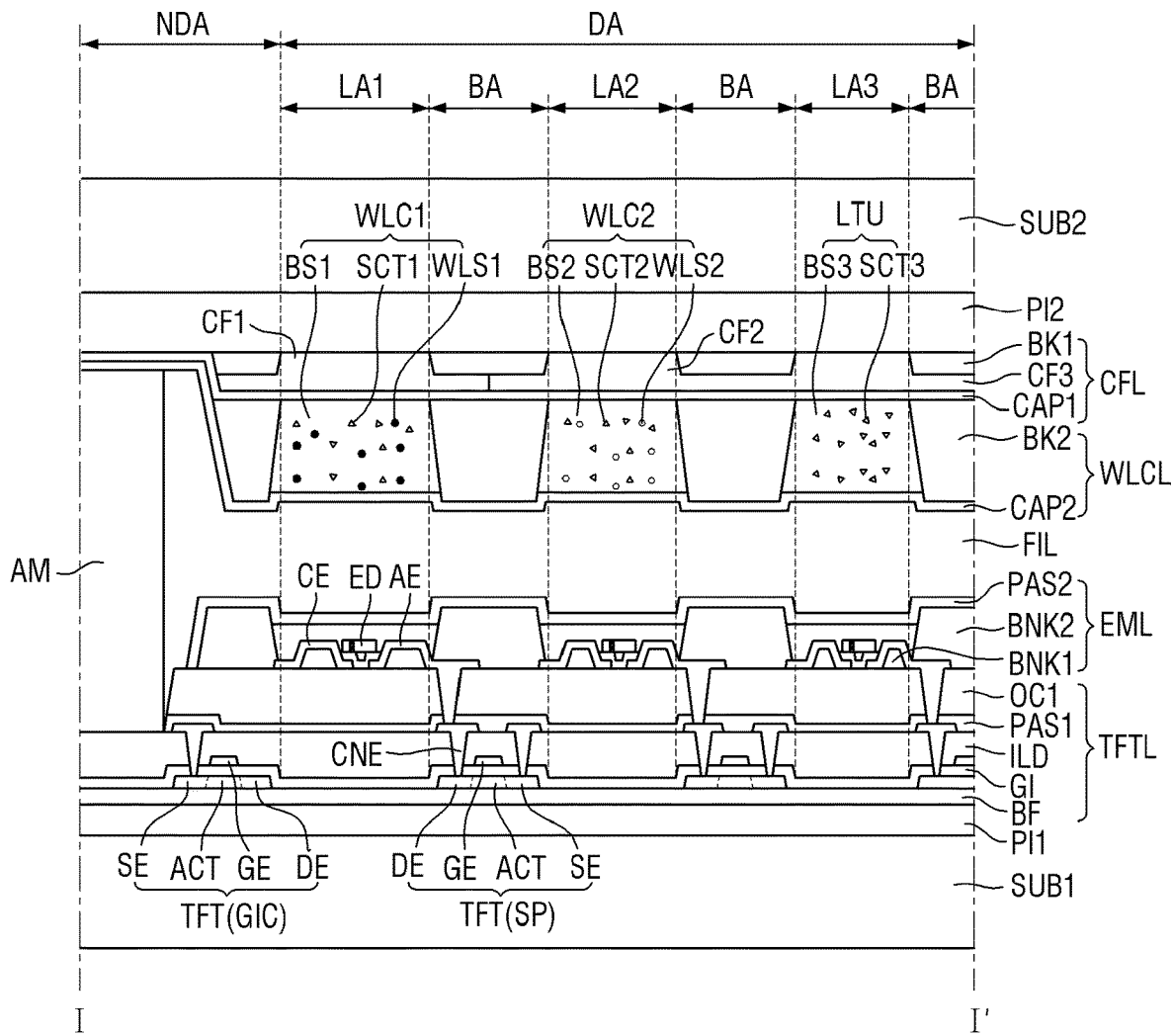
FIG. 2 is a cross-sectional view, taken along line I-I' of FIG. 1.

FIG. 2 is a cross-sectional view, taken along line I-I' of FIG. 1.

Referring to FIG. 2, a display area of a display device 10 may include first to third light-emitting areas LA1, LA2 and LA3. In each of the first to third light-emitting areas LA1, LA2 and LA3, light generated by light-emitting diodes ED of the display device 10 exits out of the display device 10.

The display device 10 may include a first base part SUB1, a first support layer PI1, a display layer DPL, a second support layer PI2, and a second base part SUB2. The display layer DPL may include a thin-film transistor layer TFTL, a light emitting element layer EML, a filler layer FIL, a sealing member AM, a wavelength conversion layer WLCL, and a color filter layer CFL.

The first base part SUB1 can support and protect the display device 10. For example, the first base part SUB1 may be, but is not limited to, a glass substrate including a glass material.

The first support layer PI1 may be disposed on the first base part SUB1 to support a surface of the display layer DPL. The first support layer PI1 may be deposited or coated on the first base part SUB1. For example, the first support layer PI1 may include, but is not limited to, polyimide (PI).

The thin-film transistor layer TFTL may be disposed on the first support layer PI1. The thin-film transistor layer TFTL may include a buffer layer BF, a thin-film transistor TFT, a gate insulator GI, an interlayer dielectric layer ILD, a connection electrode CNE, a first passivation layer PAS1, and a first planarization layer OC1.

The buffer layer BF may be disposed on the first support layer PT1. The buffer layer BF may include an inorganic material that can prevent the permeation of air or moisture. For example, the buffer layer BF may include a plurality of inorganic films stacked on one another.

The thin-film transistor TFT may be disposed on the buffer layer BF in the display area DA, and may form a pixel circuit of each of a plurality of pixels SP. For example, the thin-film transistor TFT may be a driving transistor or a switching transistor of the pixel circuit. The thin-film transistor TFT may include a semiconductor region ACT, a gate electrode GE, a source electrode SE, and a drain electrode DE.

The semiconductor region ACT, the source electrode SE and the drain electrode DE may be disposed on the buffer layer BF. The semiconductor region ACT may overlap the gate electrode GE in the thickness direction and may be insulated from the gate electrode GE by the gate insulator GI. The source electrode SE and the drain electrode DE may be formed by converting the material of the semiconductor region ACT into a conductor.

The gate electrode GE may be disposed on the gate insulator GI. The gate electrode GE may overlap the semiconductor region ACT with the gate insulator GI interposed therebetween.

The gate insulator GI may be disposed on the semiconductor region ACT, the source electrode SE and the drain electrode DE. For example, the gate insulator GI may cover the semiconductor region ACT, the source electrode SE, the drain electrode DE and the buffer layer BF1, and may insulate the semiconductor region ACT from the gate electrode GE. The gate insulator GI may include a contact hole through which the connection electrode CNE passes.

The interlayer dielectric layer ILD may be disposed over the gate electrode GE. For example, the interlayer dielectric layer ILD may include a contact hole through which the connection electrode CNE passes. The contact hole of the interlayer dielectric layer ILD may be connected to the contact hole of the gate insulator GI.

The connection electrode CNE may be disposed on the interlayer dielectric layer ILD. The connection electrode CNE may connect the drain electrode DE of the thin-film transistor TFT with a first electrode AE of the light-emitting element. The connection electrode CNE may come in contact with the drain electrode DE through the contact hole formed in the gate insulator GI and the interlayer dielectric layer ILD.

The first passivation layer PAS1 may be disposed over the connection electrode CNE to protect the thin-film transistor TFT. For example, the first passivation layer PAS1 may include a contact hole through which the first electrode AE of the light-emitting element passes.

The first planarization layer OC1 may be disposed on the first passivation layer PAS1 to provide a flat surface over the thin-film transistor layer TFTL. For example, the first planarization layer OC1 may include a contact hole through which the first electrode AE of the light-emitting element EL passes. The contact hole in the first planarization layer OC1 may be connected to the contact hole in the first passivation layer PAS1. The first planarization layer OC1 may include an organic material.

The thin-film transistor layer TFTL may further include a gate driver GIC disposed on the buffer layer BF in the non-display area NDA. The gate driver GIC may be connected to the thin-film transistors TFT of the plurality of pixels SP. The gate driver GIC may include at least one transistor TFT to form a gate driving circuit. The thin-film transistor TFT of the gate driver GIC may be disposed on the same layer as the thin-film transistors of the pixels SP, but the embodiment described herein is not limited thereto.

For another example, the gate driver GIC of the thin-film transistor layer TFTL may be disposed in the display area DA. When the display device 10 includes the gate driver GIC disposed in the display area DA, the non-display area NDA of the display device 10 can be reduced.

The light emitting element layer EML may include a light-emitting element, first banks BNK1, a second bank BNK2, and a second passivation layer PAS2.

The light-emitting element may be disposed on the thin-film transistor layer TFTL. The light-emitting element may include a first electrode AE, a second electrode CE and a light-emitting diode ED.

The first electrode AE may be disposed on the first planarization layer OC1. For example, the first electrode AE may be disposed over the first bank BNK1 disposed on the first planarization layer OC1 to cover the first bank BNK1. The first electrode AE may be disposed to overlap one of the first to third light-emitting areas LA1, LA2 and LA3 defined by the second bank BNK2. The first electrode AE may be connected to the drain electrode DE of the thin-film transistor TFT. The first electrode AE may be, but is not limited to, an anode electrode of the light-emitting element.

The second electrode CE may be disposed on the first planarization layer OC1 such that it is spaced apart from the first electrode AE. For example, the second electrode CE may be disposed over the first bank BNK1 disposed on the first planarization layer OC1 to cover the first bank BNK1. The second electrode CE may be disposed to overlap one of the first to third light-emitting areas LA1, LA2 and LA3 defined by the second bank BNK2. For example, the second electrode CE may receive a common voltage applied to all pixels. The second electrode CE may be, but is not limited to, a cathode electrode of the light-emitting element.

The light-emitting diode ED may be disposed between the first electrode AE and the second electrode CE above the first planarization layer OC1. The light-emitting diode ED may be disposed on the insulating layer covering a part of the first electrode AE and a part of the second electrode CE. One end of the light-emitting diode ED may be connected to the first electrode AE while the other end of the light-emitting diode ED may be connected to the second electrode CE. For example, the plurality of light-emitting diodes ED may include an active layer having the same material so that they may emit lights in the same wavelength range or lights of the same color. The lights emitted from the first to third light-emitting areas LA1, LA2 and LA3, respectively, may have the same color. For example, the light-emitting diodes ED may emit lights of the third color or blue light having a peak wavelength in the range of 440 nm to 480 nm. Therefore, the light emitting element layer EML may emit light of the third color or blue light.

The light-emitting diodes ED may have a size of a micro-meter or a nano-meter, and may be inorganic light-emitting diodes containing an inorganic material. Inorganic light-emitting diodes may be aligned between two electrodes facing each other by an electric field formed in a particular direction between the two electrodes.

As another example, the light-emitting element may include an organic light-emitting diode including an organic material. An organic light-emitting diode can emit light as holes and electrons are combined in an organic emissive layer by voltages applied to each of a first electrode and a second electrode of the light-emitting element The second bank BNK2 may be disposed on the first planarization layer OC1 to define first to third light-emitting areas LA1, LA, and LA3. For example, the second bank BNK2 may surround each of the first to third light-emitting areas LA1, LA2 and LA3. It is, however, to be understood that the embodiment described herein is not limited thereto. The second bank BNK2 may separate and insulate the first electrode AE or the second electrode CE of each of a plurality of light-emitting elements. The second bank BNK2 may be disposed in each of the light-blocking areas BA.

The second passivation layer PAS2 may be disposed on the light-emitting elements and the second bank BNK2. The second passivation layer PAS2 may cover the plurality of light-emitting elements to protect them. The second passivation layer PAS2 can prevent permeation of impurities such as moisture and air from outside to prevent damage to the plurality of light-emitting elements.

A filler FIL may be used to fill the space between the light emitting element layer EML and the wavelength conversion layer WLCL, and may be surrounded by the sealing member AM. For example, the filler FIL may be made of an organic material and can transmit light. The filler FIL may be made of, but is not limited to, a silicon-based organic material, an epoxy-based organic material, etc. For another example, the filler FIL may be eliminated.

The sealing member AM may be interposed between the edge of the first base part SUB1 and the edge of the second base part SUB2 in the non-display area NDA. The sealing member AM may be disposed along the first base part SUB1 and the second base part SUB2 in the non-display area NDA to seal the filler FIL. The first base part SUB1 and the second base part SUB2 may be coupled with each other by the sealing member AM. For example, the sealing member AM may include an organic material. The sealing member AM may be made of, but is not limited to, an epoxy-based resin.

The wavelength conversion layer WLCL may include a second light-blocking member BK2, a first wavelength-converting unit WLC1, a second wavelength-converting unit WLC2, the light-transmitting unit LTU, and a second capping layer CAP2.

The second light-blocking member BK2 may be disposed on the second capping layer CAP2 in the light-blocking areas BA. The second light-blocking member BK2 may overlap the second bank BNK2 in the thickness direction. The second light-blocking member BK2 can block the transmission of light. The second light-blocking member BK2 can improve the color gamut of the display devices 10 by preventing lights from intruding and mixing among the first to third light-emitting areas LA1, LA2 and LA3. The second light-blocking member BK2 may be arranged in a lattice shape surrounding the first to third light-emitting areas LA1, LA2 and LA3 on a plane.

The second light-blocking member BK2 may include an organic light-blocking material and a liquid repellent component. For example, the second light-blocking member BK2 may be made of a black organic material including the liquid repellent component. The second light-blocking member BK2 may be formed via coating and exposure processes for an organic light-blocking material containing a liquid repellent component, etc.

The first wavelength converter WLC1 may be disposed in the first light-emitting area LA1 on the second capping layer CAP2. The first wavelength converter WLC1 may be surrounded by the second light-blocking member BK2. The first wavelength-converting unit WLC1 may include a first base resin BS1, first scatterers SCT1, and first wavelength shifters WLS1.

The first base resin BS1 may include a material having a relatively high light transmittance. The first base resin BS1 may be made of a transparent organic material. For example, the first base resin BS1 may include at least one organic material among an epoxy resin, an acrylic resin, a cardo resin, and an imide resin.

The first scatterers SCT1 may have a refractive index different from that of the first base resin BS1 and may form an optical interface with the first base resin BS1. For example, the first scatterers SCT1 may include a light scattering material or light scattering particles that scatter at least a part of transmitted light. For example, the first scatterers SCT1 may include a metal oxide such as titanium oxide ($TiO_2$), zirconium oxide ($ZrO_2$), aluminum oxide ($Al_2O_3$), indium oxide ($In_2O_3$), zinc oxide (ZnO) and tin oxide ($SnO_2$) or may include organic particles such as an acrylic resin and a urethane resin. The first scatters SCT1 may scatter light in random directions irrespective of the incidence direction of the incident light, without substantially changing the peak wavelength of the incident light.

The first wavelength shifters WLS1 may convert or shift the peak wavelength of the incident light to a first peak wavelength. For example, the first wavelength shifters WLS1 may convert blue light provided from the display device 10 into red light having a single peak wavelength in the range of 610 nm to 650 nm, and output the light. The first wavelength shifters WLS1 may be quantum dots, quantum rods, or phosphor. The quantum dots may be particulate matter that emits a color as electrons transition from the conduction band to the valence band.

A part of the blue light emitted from the light emitting element layer EML may pass through the first wavelength-converting unit WLC1 without being converted into red light by the first wavelength shifters WLS1. When such blue light is incident on the first color filter CF1, it can be blocked by the first color filter CF1. On the other hand, red light converted by the first wavelength-converting unit WLC1 may pass through the first color filter CF1 to exit to the outside. Accordingly, the first light-emitting area LA1 may emit red light.

The second wavelength-converting unit WLC2 may be disposed in the second light-emitting area LA2 on the second capping layer CAP2. The second wavelength-converting unit WLC2 may be surrounded by the second light-blocking member BK2. The second wavelength-converting unit WLC2 may include a second base resin BS2, second scatterers SCT2, and second wavelength shifters WLS2.

The second base resin BS2 may include a material having a relatively high light transmittance. The second base resin BS2 may be made of a transparent organic material. For example, the second base resin BS2 may be made of the same material as the first base resin BS1 or may be made of one of the above-listed materials of the first base resin BS1.

The second scatterers SCT2 may have a refractive index different from that of the second base resin BS2 and may form an optical interface with the second base resin BS2. For example, the second scatterers SCT2 may include a light scattering material or light scattering particles that scatter at least a part of transmitted light. For example, the second scatterers SCT2 may be made of the same material as the first scatterers SCT1 or may be made of one of the above-listed materials of the first scatterers SCT1. The second scatters SCT2 may scatter light in random directions irrespective of the incidence direction of the incident light, without substantially changing the peak wavelength of the incident light.

The second wavelength shifters WLS2 may convert or shift the peak wavelength of the incident light to a second peak wavelength that is different from the first peak wavelength of the first wavelength shifters WLS1. For example, the second wavelength shifters WLS2 may convert blue light provided from the display device 10 into blue light having a single peak wavelength in the range of 510 nm to 550 nm, and output the light. The second wavelength shifters WLS2 may be quantum dots, quantum rods, or phosphor. The second wavelength shifters WLS2 may include the above-listed materials of the first wavelength shifters WLS1. The wavelength conversion range of the second wavelength shifters WLS2 may be formed of quantum dots, quantum rods or phosphor so that it is different from the wavelength conversion range of the first wavelength shifters WLS1.

The light-transmitting unit LTU may be disposed in the third light-emitting area LA3 on the second capping layer CAP2. The light-transmitting unit LTU may be surrounded by the second light-blocking member BK2. The light-transmitting unit LTU may transmit the incident light without converting its peak wavelength. The light-transmitting unit LTU may include a third base resin BS3 and third scatterers SCT3.

The third base resin BS3 may include a material having a relatively high light transmittance. The third base resin BS3 may be made of a transparent organic material. For example, the third base resin BS3 may be made of the same material as the first base resin BS1 or the second resin BS2 or may be made of one of the above-listed materials of the first base resin BS1 or the second base resin BS2.

The third scatterers SCT3 may have a refractive index different from that of the third base resin BS3 and may form an optical interface with the third base resin BS3. For example, the third scatterers SCT3 may include a light scattering material or light scattering particles that scatter at least a part of transmitted light. For example, the third scatterers SCT3 may be made of the same material as the first scatterers SCT1 or the second scatterers SCT2, or may be made of one of the above-listed materials of the first scatterers SCT1 or the second scatterers SCT2. The third scatters SCT3 may scatter light in random directions irrespective of the incidence direction of the incident light, without substantially changing the peak wavelength of the incident light.

The second capping layer CAP2 may cover the bottoms of the first and second wavelength-converting units WLC1 and WLC2, the light-transmitting unit LTU and a first light-blocking member BK1. For example, the second capping layer CAP2 may seal the first and second wavelength-converting units WLC1 and WLC2 and the light-transmitting unit LTU to thereby prevent damage or contamination to the first and second wavelength-converting units WLC1 and WLC2 and the light-transmitting unit LTU. For example, the second capping layer CAP2 may include an inorganic material.

The color filter layer CFL may include the first capping layer CAP1, the first light-blocking member BK1, and the first to third color filters CF1, CF2, and CF3.

The first capping layer CAP1 may be disposed on the wavelength conversion layer WLCL. The first capping layer CAP1 may seal the lower surfaces of the first to third color filters CF1, CF2, and CF3. For example, the first capping layer CAP1 may include an inorganic material.

The first light-blocking member BK1 may be disposed under the second support layer PI2 in the light-blocking areas BA. The first light-blocking member BK1 may overlap the second light-blocking member BK2 or the second bank BNK2 in the thickness direction. The first light-blocking member BK1 can block the transmission of light. The first light-blocking member BK1 can improve the color gamut of the display devices 10 by preventing lights from intruding and mixing among the first to third light-emitting areas LA1, LA2 and LA3. The first light blocking member BK1 may be arranged in a lattice shape surrounding the first to third light-emitting regions LA1, LA2, and LA3 on a plane.

The first color filter CF1 may be disposed in the first light-emitting area LA1 under the second support layer PI2. The first color filter CF1 may be surrounded by the first light-blocking member BK1. The first color filter CF1 may overlap the first wavelength-converting unit WLC1 in the thickness direction. The first color filter CF1 may selectively transmit light of the first color (e.g., red light) and may block and absorb light of the second color (e.g., green light) and light of the third color (e.g., blue light). For example, the first color filter CF1 may be a red color filter and may include a red colorant.

The second color filter CF2 may be disposed in the second light-emitting area LA2 under the second support layer PI2. The second color filter CF2 may be surrounded by the first light-blocking member BK1. The second color filter CF2 may overlap the second wavelength-converting unit WLC2 in the thickness direction. The second color filter CF2 may selectively transmit light of the second color (e.g., green light) and may block and absorb light of the first color (e.g., red light) and light of the third color (e.g., blue light). For example, the second color filter CF2 may be a green color filter and may include a green colorant.

The third color filter CF3 may be disposed in the third light-emitting area LA3 under the second support layer PI2. The third color filter CF3 may be surrounded by the first light-blocking member BK1. The third color filter CF3 may overlap the light-transmitting unit LTU in the thickness direction. The third color filter CF3 may selectively transmit light of the third color (e.g., blue light) and may block and absorb light of the first color (e.g., red light) and light of the second color (e.g., green light). For example, the third color filter CF3 may be a blue color filter and may include a blue colorant.

The first to third color filters CF1, CF2 and CF3 may absorb a part of the light introduced from the outside of the display device 10 to reduce reflection of external light. Accordingly, the first to third color filters CF1, CF2 and CF3 can prevent color distortion due to reflection of external light.

The second support layer PI2 may be disposed under the second base part SUB2 to support the opposite surface of the display layer DPL. The second support layer PI2 may be deposited or coated on the second base part SUB2. For example, the second support layer PI2 may include, but is not limited to, polyimide (PI).

The second base part SUB2 may be disposed on the second support layer PI2. The second base part SUB2 can support and protect the display device 10. For example, the second base part SUB2 may be, but is not limited to, a glass substrate including a glass material or an encapsulation substrate. The second base part SUB2 can prevent permeation of oxygen or moisture, and can protect the display device 10 from particles such as dust.

Figure 3:
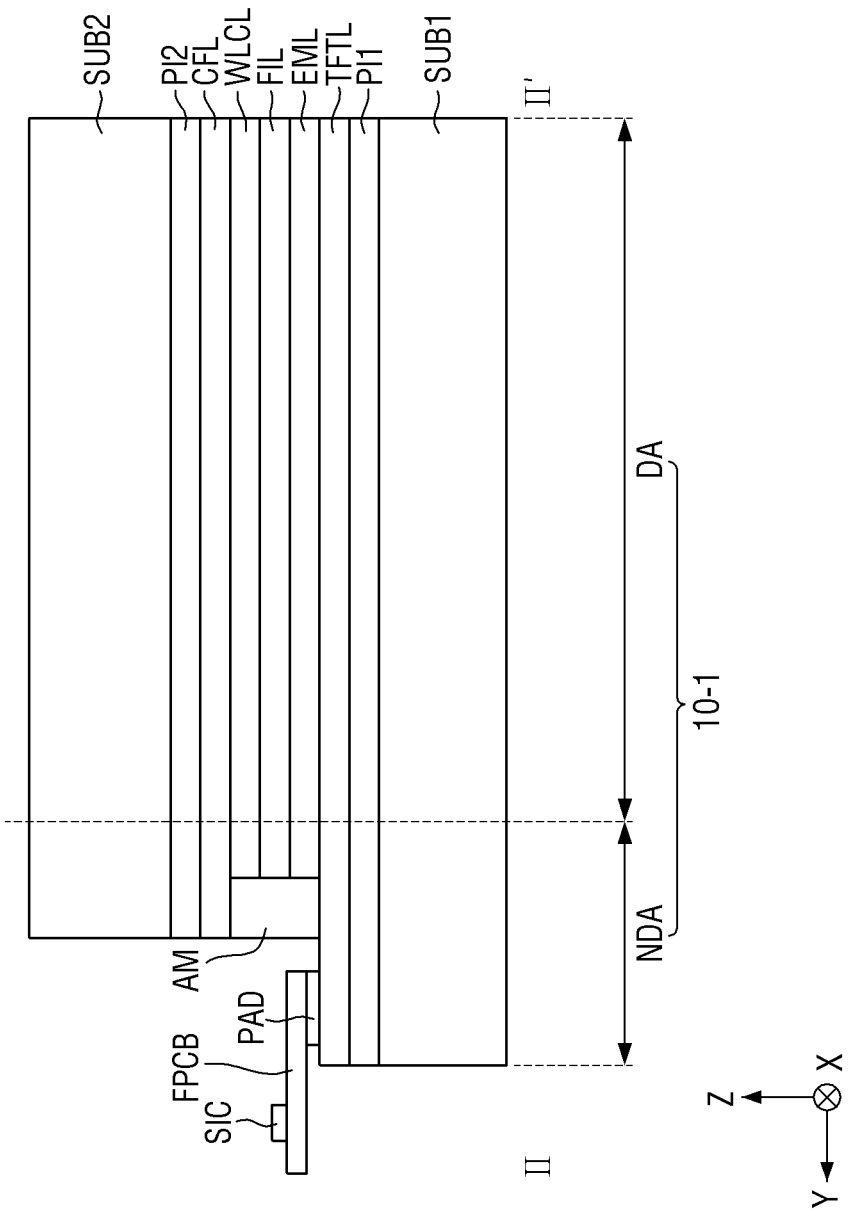
FIG. 3 is a cross-sectional view taken along line II-II' of FIG. 1.

FIG. 3 is a cross-sectional view taken along line II-II' of FIG. 1. In the following description, the same elements as those described above will be briefly described or omitted for ease in explanation of this figure.

Referring to FIG. 3, the display device 10 may include the first base part SUB1, the first support layer PI1, the display layer DPL, the second support layer PI2, and the second base part SUB2. The display layer DPL may include the thin-film transistor layer TFTL, the light emitting element layer EML, the filler layer FIL, the sealing member AM, the wavelength conversion layer WLCL, and the color filter layer CFL.

The display device 10 may further include a pad PAD, a flexible film FPCB, and a source driver SIC disposed in the non-display area NDA.

The pad PAD may be disposed on the thin-film transistor layer TFTL in the non-display area NDA. The pad PAD may be disposed more to the outside than the sealing member AM that couples the first base part SUB1 with the second base part SUB2. The pad PAD may be connected to the thin-film transistor TFT of the thin-film transistor layer TFTL through a connection line.

The flexible film FPCB may be attached to a surface of the pad PAD. For example, the flexible film FPCB may be disposed, but is not limited to, on the pad PAD through an anisotropic conductive film. One side of the flexible film FPCB may be connected to the pad PDA, while the other side of the flexible film FPCB may be connected to a source circuit board (not shown). The flexible film FPCB may transmit a signal from the source driver SIC to the thin-film transistor TFT of the thin-film transistor TFTL.

The source driver SIC may be disposed on the flexible film FPCB, and may be connected to a plurality of pixels of the display device 10. For example, the source driver SIC may be an integrated circuit (IC). The source driver SIC may convert digital video data into analog data voltage based on a source control signal from a timing controller, and may supply it to data lines of the display area DA through the flexible film FPCB.

Figure 4:
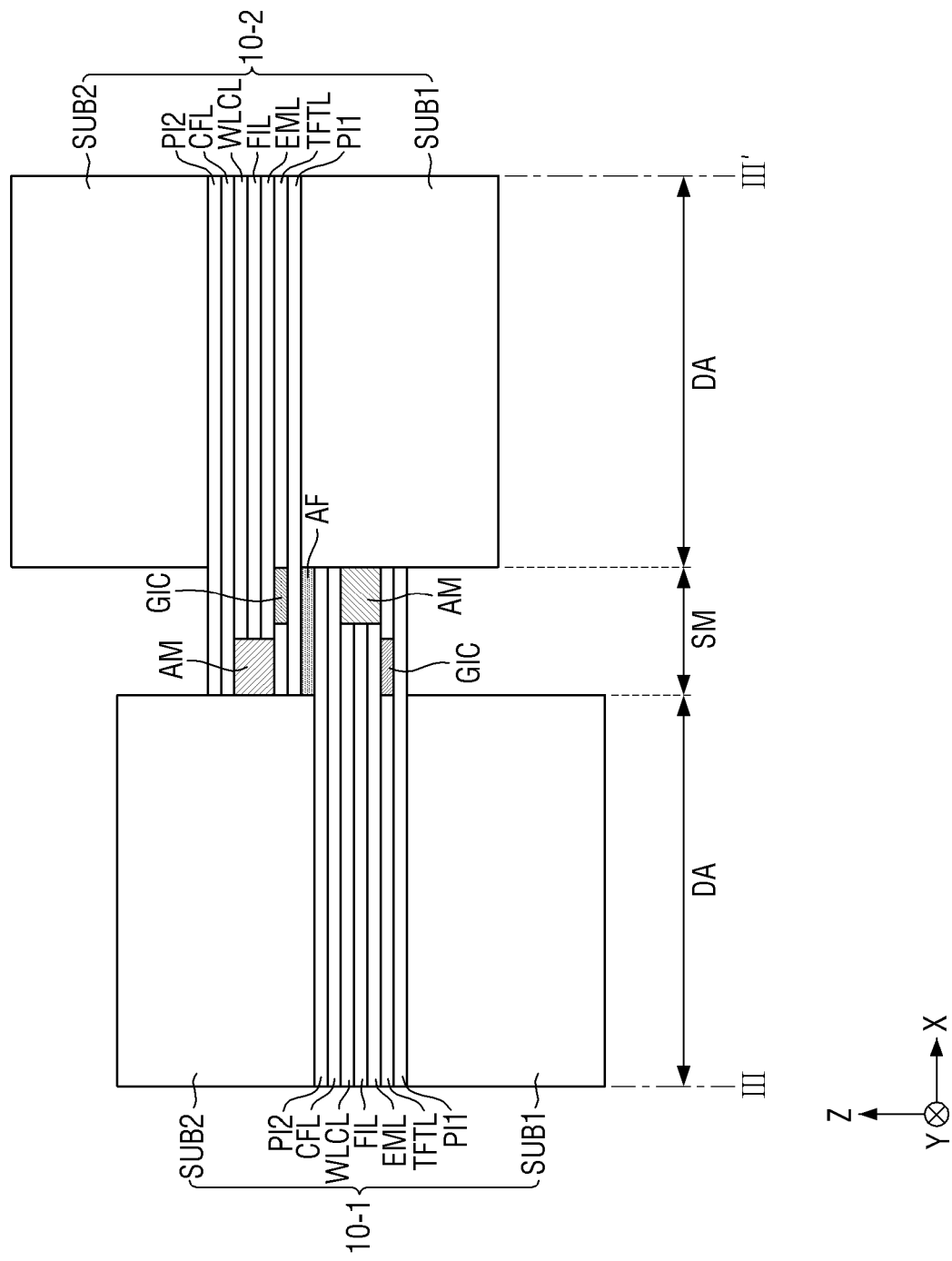
FIG. 4 is an example of a cross-sectional view, taken along line III-III' of FIG. 1.

FIG. 4 is an example of a cross-sectional view, taken along line III-III' of FIG. 1.

Referring to FIG. 4, the tiled display TD may include a display area DA of the first display device 10-1, a display area DA of the second display device 10-2, and a seam SM between the display areas DA of the first and second display devices 10-1 and 10-2.

Each of the display devices 10-1 and 10-2 may include the first base part SUB1, the first support layer PI1, the display layer DPL, the second support layer PI2, and the second base part SUB2.

The first base part SUB1 of the first display device 10-1 may be disposed in the display area DA. The first base part SUB1 may support a surface of the first support layer PI1. For example, the first base part SUB1 may be, but is not limited to, a glass substrate including a glass material. The first base part SUB1 may support the display area DA and the non-display area NDA during the process of fabricating the first display device 10-1. The part of the first base part SUB1 corresponding to the seam SM may be removed before the first and second display devices 10-1 and 10-2 are coupled together. Accordingly, the first base part SUB1 of the first display device 10-1 may not be disposed in the seam SM. The first base part SUB1 of the first display device 10-1 may be spaced apart from the first base part SUB1 of the second display device 10-2 with the seam SM therebetween.

The first support layer PI1 may be disposed on the first base part SUB1 in the display area DA and the seam SM. The first support layer PI1 may support one surface of the display layer DPL. For example, the first support layer PI1 may include, but is not limited to, polyimide (PI). The side surface of the first support layer PI1 of the first display device 10-1 may be in contact with the side surface of the first base part SUB1 of the second display device 10-2.

The display layer DPL may be disposed on the first support layer PI1 in the display area DA and the seam SM. The display layer DPL may include the thin-film transistor layer TFTL, the light emitting element layer EML, the filler layer FIL, the sealing member AM, the wavelength conversion layer WLCL, and the color filter layer CFL. Optionally, the side surface of the display layer DPL of the first display device 10-1 may be in contact with the side surface of the first base part SUB1 of the second display device 10-2.

The second support layer PI2 may be disposed on the display layer DPL in the display area DA and the seam SM. The second support layer PI2 may be disposed on the surface of the second base part SUB2 to support the opposite surface of the display layer DPL. For example, the second support layer PI2 may include, but is not limited to, polyimide (PI). The side surface of the second support layer PI2 of the first display device 10-1 may be in contact with the side surface of the first base part SUB1 of the second display device 10-2.

The second base part SUB2 may be disposed on the second support layer PI2 in the display area DA. The second base part SUB2 may support the opposite surface of the second support layer PI2. For example, the second base part SUB2 may be, but is not limited to, a glass substrate including a glass material. The second base part SUB2 may support the display area DA and the non-display area NDA during the process of fabricating the first display device 10-1. The part of the first base part SUB1 corresponding to the seam SM may be removed before the first and second display devices 10-1 and 10-2 are coupled together. Accordingly, the second base part SUB2 of the first display device 10-1 may not be disposed in the seam SM. The second base part SUB2 of the first display device 10-1 may be spaced apart from the second base part SUB2 of the second display device 10-2 with the seam SM therebetween.

The tiled display TD may further include an adhesive film AF. The adhesive film AF may attach the upper surface of the second support layer PI2 of the first display device 10-1 to the lower surface of the first support layer PI1 of the second display device 10-2 in the seam SM. For example, the adhesive film AF may include an adhesive applied on either side, so that the first and second display devices 10-1 and 10-2 may be coupled with each other. Accordingly, the non-display areas NDA of the first and second display devices 10-1 and 10-2 adjacent to each other may overlap each other in the thickness direction (or the z-axis direction) in the seam SM.

The first base part SUB1 of the second display device 10-2 may be disposed in the display area DA. The first base part SUB1 may support a surface of the first support layer PI1. For example, the first base part SUB1 may be, but is not limited to, a glass substrate including a glass material. The first base part SUB1 may support the display area DA and the non-display area NDA during the process of fabricating the second display device 10-2. The part of the first base part SUB1 corresponding to the seam SM may be removed before the first and second display devices 10-1 and 10-2 are coupled together. Accordingly, the first base part SUB1 of the second display device 10-2 may not be disposed in the seam SM. The first base part SUB1 of the first display device 10-1 may be spaced apart from the first base part SUB1 of the second display device 10-2 with the seam SM therebetween.

The first support layer PI1 may be disposed on the first base part SUB1 in the display area DA and the seam SM.

The first support layer PI1 may support one surface of the display layer DPL. For example, the first support layer PI1 may include, but is not limited to, polyimide (PI). The side surface of the first support layer PI1 of the second display device 10-2 may be in contact with the side surface of the second base part SUB2 of the first display device 10-1. The lower surface of the first support layer PI1 of the second display device 10-2 may be attached to the upper surface of the second support layer PI2 of the first display device 10-1 in the seam SM.

The display layer DPL may be disposed on the first support layer PI1 in the display area DA and the seam SM. The display layer DPL may include the thin-film transistor layer TFTL, the light emitting element layer EML, the filler layer FIL, the sealing member AM, the wavelength conversion layer WLCL, and the color filter layer CFL. Optionally, the side surface of the display layer DPL of the second display device 10-2 may be in contact with the side surface of the second base part SUB2 of the first display device 10-1. The sealing member AM of the first display device 10-1 may face the side surface of the first base part SUB1 of the second display device 10-2. The sealing member AM of the second display device 10-2 may face the side surface of the second base part SUB2 of the first display device 10-1.

The second support layer PI2 may be disposed on the display layer DPL in the display area DA and the seam SM. The second support layer PI2 may be disposed on the surface of the second base part SUB2 to support the opposite surface of the display layer DPL. For example, the second support layer PI2 may include, but is not limited to, polyimide (PI). The side surface of the second support layer PI2 of the second display device 10-2 may be in contact with the side surface of the second base part SUB2 of the first display device 10-1.

The second base part SUB2 may be disposed on the second support layer PI2 in the display area DA. The second base part SUB2 may support the opposite surface of the second support layer PI2. For example, the second base part SUB2 may be, but is not limited to, a glass substrate including a glass material. The second base part SUB2 may support the display area DA and the non-display area NDA during the process of fabricating the second display device 10-2. The part of the second base part SUB2 corresponding to the seam SM may be removed before the first and second display devices 10-1 and 10-2 are coupled together. Accordingly, the second base part SUB2 of the second display device 10-2 may not be disposed in the seam SM. The second base part SUB2 of the first display device 10-1 may be spaced apart from the second base part SUB2 of the second display device 10-2 with the seam SM therebetween.

The thickness of each of the first and second base parts SUB1 and SUB2 may be larger than the thickness of the display layer DPL. For example, the thickness of each of the first and second base parts SUB1 and SUB2 may be multiple times the thickness of the display layer DPL, but the embodiment described herein is not limited thereto. Each of the first and second display devices 10-1 and 10-2 includes first and second base parts SUB1 and SUB2 having a predetermined thickness, so that the first and second display devices 10-1 can be supported stably as they are coupled together.

The non-display areas NDA of the first and second display devices 10-1 and 10-2 may overlap each other in the thickness direction (or the z-axis direction) in a single seam SM. Accordingly, the display areas DA of the display devices 10 may be so close to each other that the seams SM therebetween are not recognized by a viewer. The reflectance of external light at the display areas DA of the plurality of display devices 10 may be substantially equal to the reflectance of external light at the seams SM between the display devices 10. Accordingly, it is possible to prevent the seams SM between the display devices 10 of the tiled display TD from being recognized by a viewer, thereby eliminating visible seams and allowing the viewer to get immersed into the displayed images.

Figure 5:
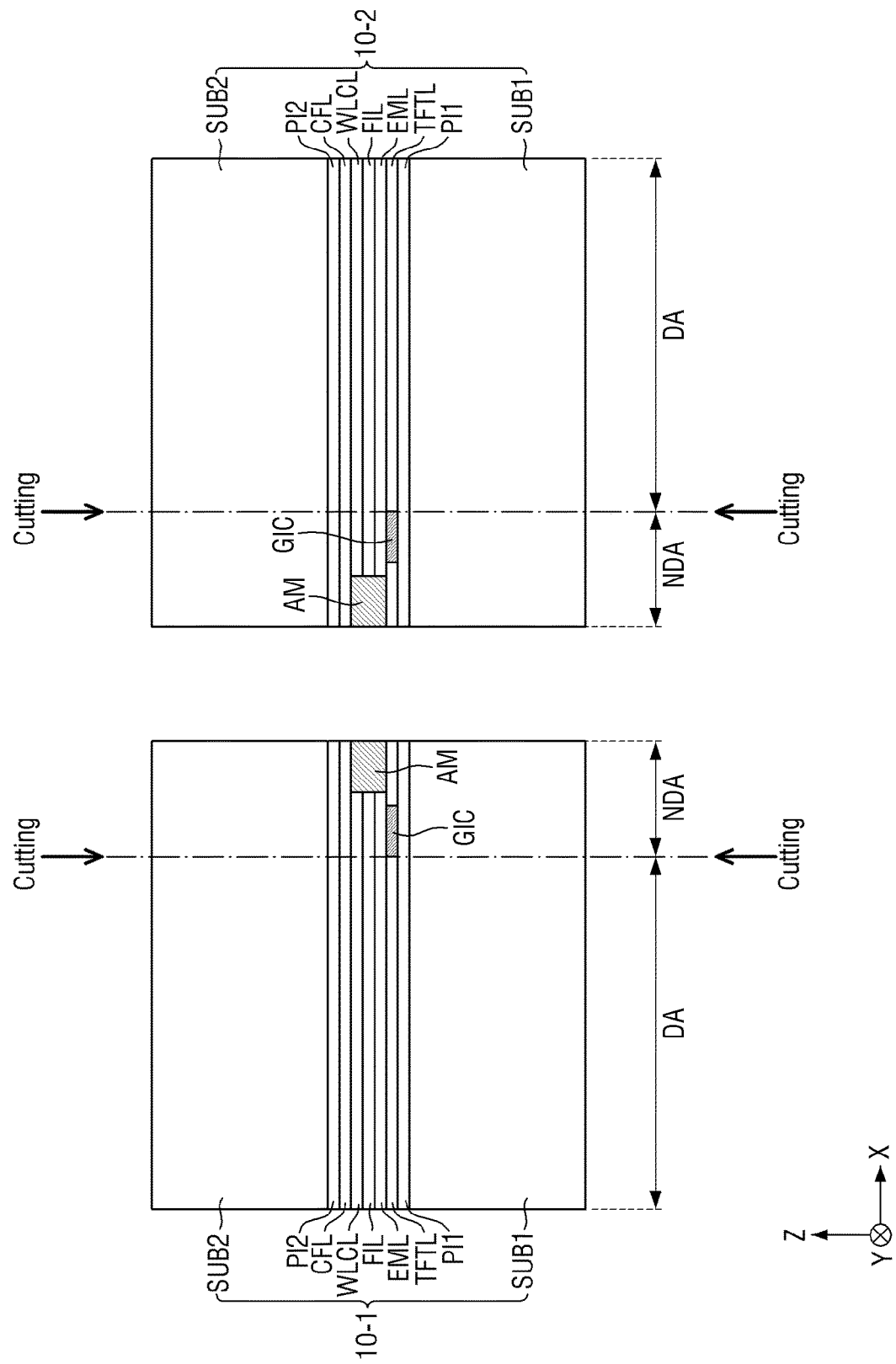
FIGS. 5 and 6 are cross-sectional views showing processes of fabricating the tiled display of FIG. 4.
Figure 6:
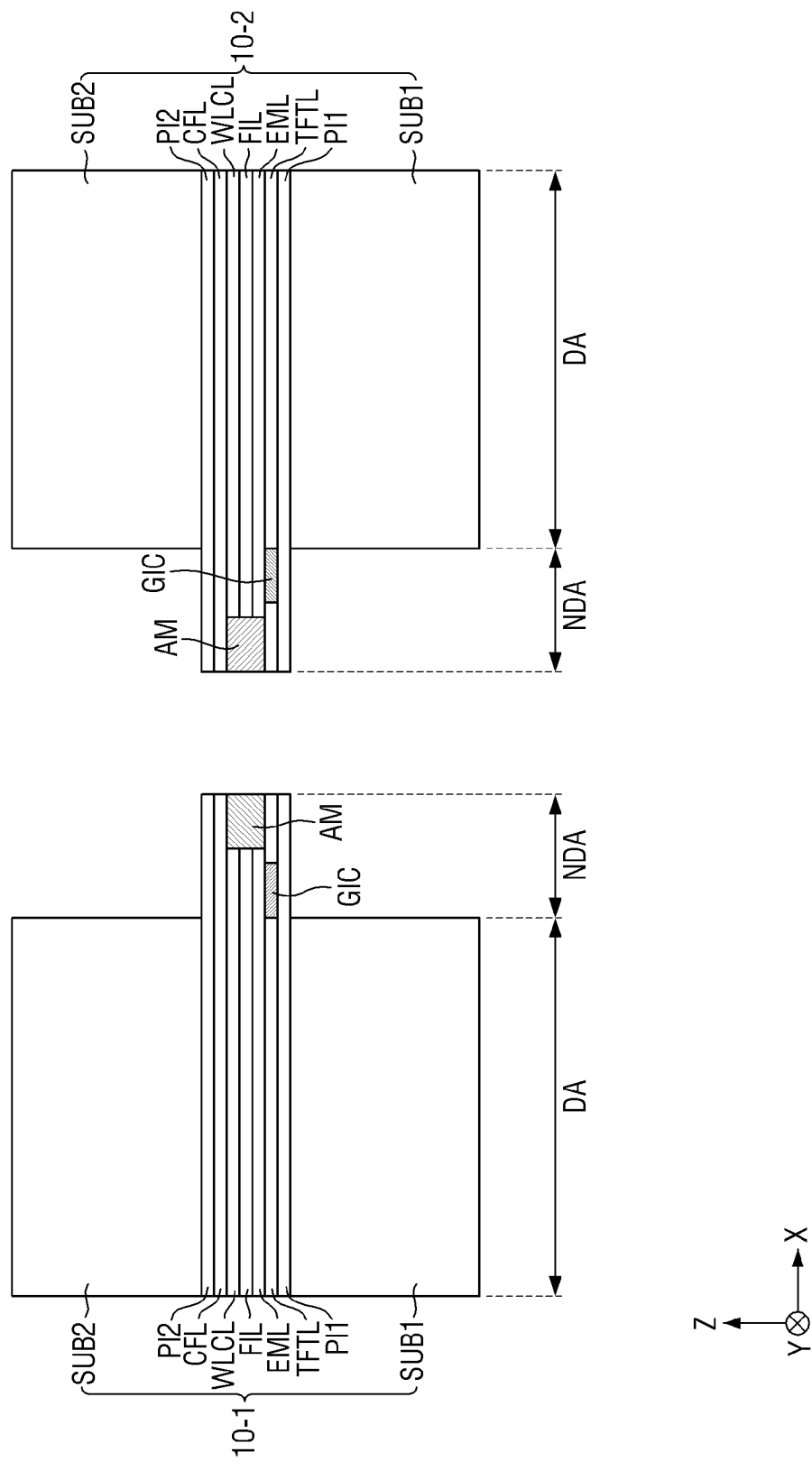

FIGS. 5 and 6 are cross-sectional views showing processes of fabricating the tiled display of FIG. 4.

In the example shown in FIG. 5, each of the display devices 10-1 and 10-2 may include the first base part SUB1, the first support layer PI1, the display layer DPL, the second support layer PI2, and the second base part SUB2.

The first support layer PI1, the thin-film transistor layer TFTL and the light emitting element layer EML may be sequentially stacked on the first base part SUB1. The first base part SUB1 may support the display area DA and the non-display area NDA during the process of fabricating the first and second display devices 10-1 and 10-2.

The second support layer PI2, the color filter layer CFL and the wavelength conversion layer WLCL may be sequentially stacked on the second base part SUB2. The second base part SUB2 may support the display area DA and the non-display area NDA during the process of fabricating the first and second display devices 10-1 and 10-2.

The first base part SUB1 and the second base part SUB2 may be attaching together by the sealing member AM. The filler FIL may be used to fill between the light emitting element layer EML on the first base part SUB1 and the wavelength conversion layer WLCL on the second base part SUB2. The sealing member AM may be disposed along the first base part SUB1 and the second base part SUB2 in the non-display area NDA to seal the filler FIL.

In FIG. 6, the first and second base parts SUB1 and SUB2 are attached together, and then the part of each of the first and second base parts SUB1 and SUB2 corresponding to the seams SM may be removed. The process of removing a part of the first and second base parts SUB1 and SUB2 may include, but is not limited to, a cutting process.

The non-display areas NDA of the first and second display devices 10-1 and 10-2 adjacent to each other may overlap each other in the thickness direction (or the z-axis direction) in the seam SM. The upper surface of the second support layer PI2 of the first display device 10-1 may be attached to the lower surface of the first support layer PI1 of the second display device 10-2 by an adhesive film AF.

Figure 7:
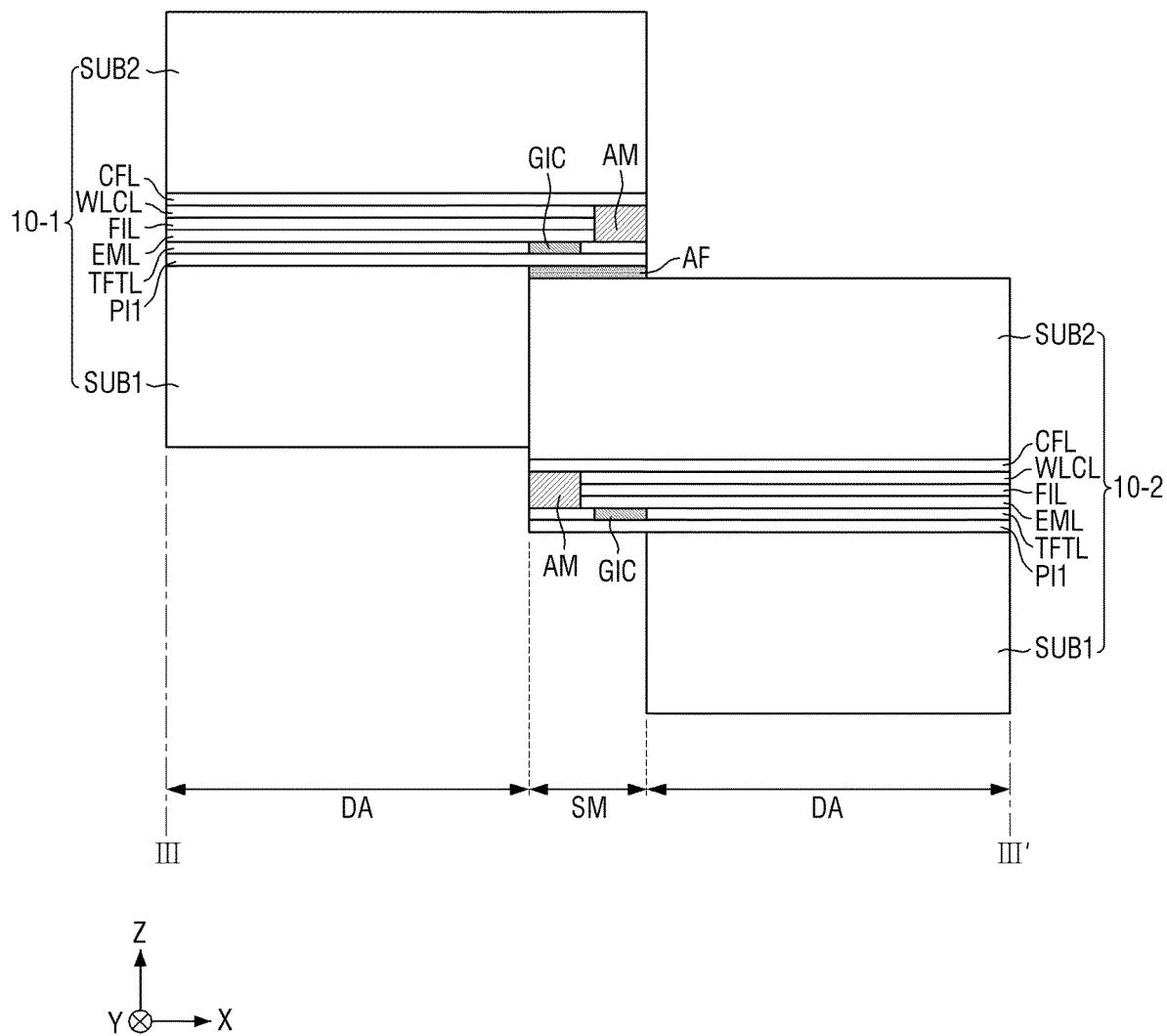
FIG. 7 is another example of a cross-sectional view taken along line III-III' of FIG. 1.

FIG. 7 is another example of a cross-sectional view taken along line III-III' of FIG. 1. The tiled display of FIG. 7 is substantially identical to the tiled display of FIG. 4 except for coupling relationship between first and second display devices; and, therefore, the redundant description will be omitted for ease in explanation of this figure.

Referring to FIG. 7, the tiled display TD may include a display area DA of the first display device 10-1, a display area DA of the second display device 10-2, and a seam SM between the display areas DA of the first and second display devices 10-1 and 10-2.

Each of the display devices 10-1 and 10-2 may include the first base part SUB1, the first support layer PI1, the display layer DPL, and the second base part SUB2.

The first base part SUB1 of the first display device 10-1 may be disposed in the display area DA. The first base part SUB1 may support a surface of the first support layer PI1. For example, the first base part SUB1 may be, but is not limited to, a glass substrate including a glass material. The first base part SUB1 may support the display area DA and the non-display area NDA during the process of fabricating the first display device 10-1. The part of the first base part SUB1 corresponding to the seam SM may be removed before the first and second display devices 10-1 and 10-2 are coupled together. Accordingly, the first base part SUB1 of the first display device 10-1 may not be disposed in the seam SM. The side surface of the first base part SUB1 of the first display device 10-1 may be in contact with the side surface of the second base part SUB2 of the second display device 10-2 in the seam SM.

The first support layer PI1 may be disposed on the first base part SUB1 in the display area DA and the seam SM. The first support layer PI1 may support one surface of the display layer DPL. For example, the first support layer PI1 may include, but is not limited to, polyimide (PI).

The display layer DPL may be disposed on the first support layer PI1 in the display area DA and the seam SM. The display layer DPL may include the thin-film transistor layer TFTL, the light emitting element layer EML, the filler layer FIL, the sealing member AM, the wavelength conversion layer WLCL, and the color filter layer CFL.

The second base part SUB2 may be disposed on the display layer DPL in the display area DA and the seam SM. The second base part SUB2 may support the opposite surface of the display layer DPL. For example, the second base part SUB2 may be, but is not limited to, a glass substrate including a glass material. The second base part SUB2 may support the display area DA and the non-display area NDA of the first display device 10-1. Since the opposite surface of the display layer DPL in the first display device 10-1 is supported by the second base part SUB2, no additional support layer is required between the second base part SUB2 and the display layer DPL. The second base parts SUB2 of the first and second display devices 10-1 and 10-2 may overlap each other in the thickness direction (or the z-axis direction) in the seam SM.

The tiled display TD may further include an adhesive film AF. The adhesive film AF may attach the lower surface of the first support layer PI1 of the first display device 10-1 to the upper surface of the second base part SUB2 of the second display device 10-2 in the seam SM. For example, the adhesive film AF may include an adhesive applied on either side, so that the first and second display devices 10-1 and 10-2 may be coupled with each other. Accordingly, the non-display areas NDA of the first and second display devices 10-1 and 10-2 adjacent to each other may overlap each other in the thickness direction (or the z-axis direction) in the seam SM. The display layers DPL of the first display device 10-1 and the second display device 10-2 may overlap the adhesive film AM in the thickness direction (or the z-axis direction) in the seam SM.

The first base part SUB1 of the second display device 10-2 may be disposed in the display area DA. The first base part SUB1 may support a surface of the first support layer PI1. For example, the first base part SUB1 may be, but is not limited to, a glass substrate including a glass material. The first base part SUB1 may support the display area DA and the non-display area NDA during the process of fabricating the second display device 10-2. The part of the first base part SUB1 corresponding to the seam SM may be removed before the first and second display devices 10-1 and 10-2 are coupled together. Accordingly, the first base part SUB1 of the second display device 10-2 may not be disposed in the seam SM.

The first support layer PI1 may be disposed on the first base part SUB1 in the display area DA and the seam SM. The first support layer PI1 may support one surface of the display layer DPL. For example, the first support layer PI1 may include, but is not limited to, polyimide (PI).

The display layer DPL may be disposed on the first support layer PI1 in the display area DA and the seam SM. The display layer DPL may include the thin-film transistor layer TFTL, the light emitting element layer EML, the filler layer FIL, the sealing member AM, the wavelength conversion layer WLCL, and the color filter layer CFL.

The second base part SUB2 may be disposed on the display layer DPL in the display area DA and the seam SM. The second base part SUB2 may support the opposite surface of the display layer DPL. For example, the second base part SUB2 may be, but is not limited to, a glass substrate including a glass material. The second base part SUB2 may support the display area DA and the non-display area NDA. Since the opposite surface of the display layer DPL in the second display device 10-2 is supported by the second base part SUB2, no additional support layer is required between the second base part SUB2 and the display layer DPL. The second base parts SUB2 of the first and second display devices 10-1 and 10-2 may overlap each other in the thickness direction (or the z-axis direction) in the seam SM. The side surface of the second base part SUB2 of the second display device 10-2 may be in contact with the side surface of the first base part SUB1 of the first display device 10-1.

The thickness of each of the first and second base parts SUB1 and SUB2 may be larger than the thickness of the display layer DPL. For example, the thickness of each of the first and second base parts SUB1 and SUB2 may be multiple times the thickness of the display layer DPL, but the present disclosure is not limited thereto. Each of the first and second display devices 10-1 and 10-2 includes first and second base parts SUB1 and SUB2 having a predetermined thickness, so that the first and second display devices 10-1 and 10-2 can be supported stably as they are coupled together.

The non-display areas NDA of the first and second display devices 10-1 and 10-2 may overlap each other in the thickness direction (or the z-axis direction) in a single seam SM. Accordingly, the display areas DA of the plurality of display devices 10 may be so close to each other that the seams SM therebetween are not recognized by a viewer. The reflectance of external light at the display areas DA of the plurality of display devices 10 may be substantially equal to the reflectance of external light at the seams SM between the display devices 10. Accordingly, it is possible to prevent the seams SM between the display devices 10 of the tiled display TD from being recognized by a viewer, thereby eliminating visible seams and allowing the viewer to get immersed into the displayed images without being hindered by unsightly seams between portions of an image being displayed.

FIGS. 8 and 9 are cross-sectional views showing processes of fabricating the tiled display of FIG. 7.

In FIG. 8, each of the display devices 10-1 and 10-2 may include the first base part SUB1, the first support layer PI1, the display layer DPL, and the second base part SUB2.

The first support layer PI1, the thin-film transistor layer TFTL and the light emitting element layer EML may be sequentially stacked on the first base part SUB1. The first base part SUB1 may support the display area DA and the non-display area NDA during the process of fabricating the first and second display devices 10-1 and 10-2.

The color filter layer CFL and the wavelength conversion layer WLCL may be sequentially stacked on the second base part SUB2. The second base part SUB2 may support the display area DA and the non-display area NDA during the process of fabricating the first and second display devices 10-1 and 10-2.

The first base part SUB1 and the second base part SUB2 may be attaching together by the sealing member AM. The filler FIL may be used to fill between the light emitting element layer EML on the first base part SUB1 and the wavelength conversion layer WLCL on the second base part SUB2. The sealing member AM may be disposed along the first base part SUB1 and the second base part SUB2 in the non-display area NDA to seal the filler FIL.

In FIG. 9, the first and second base parts SUB1 and SUB2 are attached together, and then the parts of the second base parts SUB2 corresponding to the seams SM may be removed. The process of removing the parts of the second base parts SUB2 may include, but is not limited to, a cutting process.

The non-display areas NDA of the first and second display devices 10-1 and 10-2 adjacent to each other may overlap each other in the thickness direction (or the z-axis direction) in the seam SM. The lower surface of the first support layer PI1 of the first display device 10-1 may be attached to the upper surface of the second base part SUB2 of the second display device 10-2 by the adhesive film AF.

Figure 10:
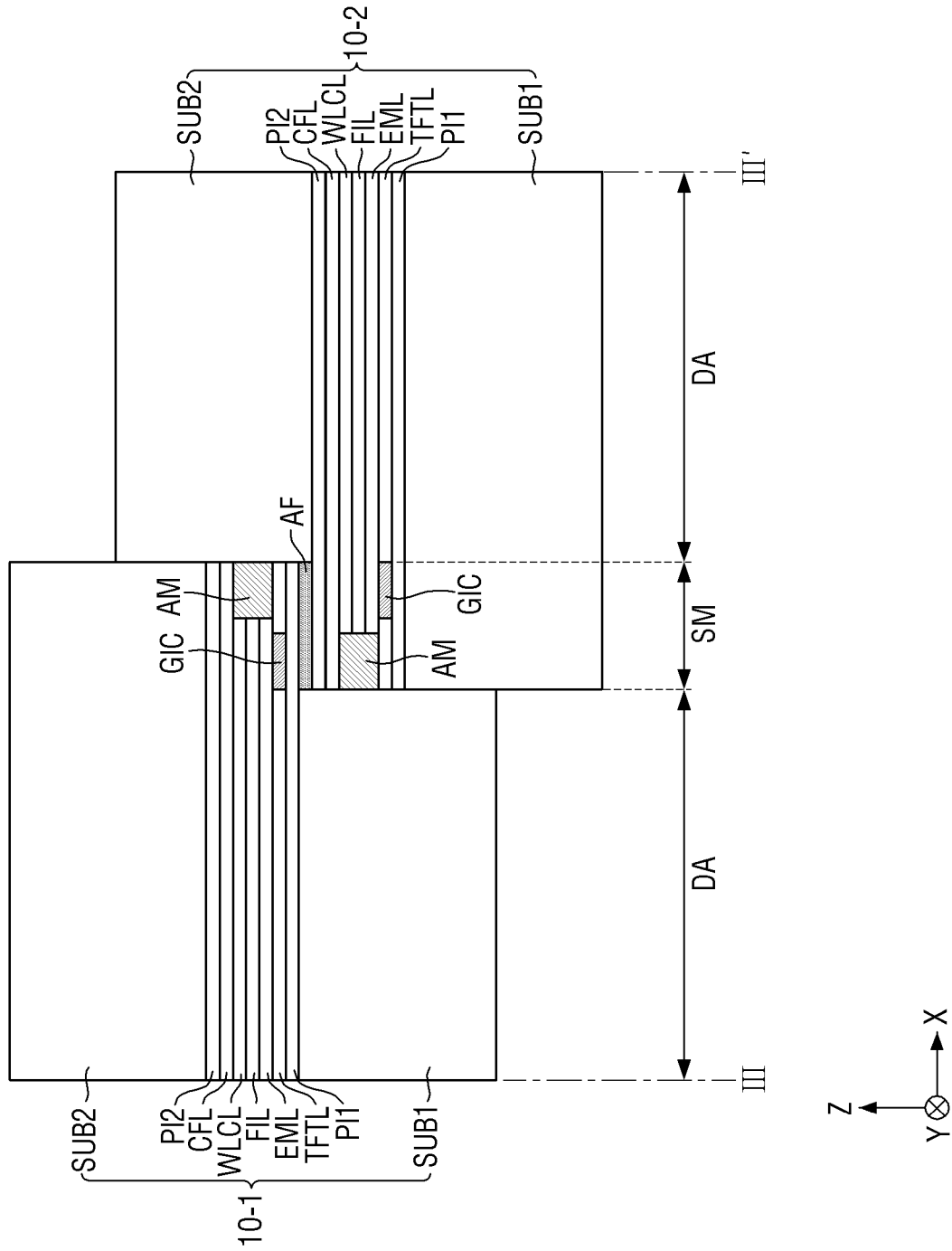
FIG. 10 is yet another example of a cross-sectional view taken along line III-III' of FIG. 1.

FIG. 10 is yet another example of a cross-sectional view taken along line III-III' of FIG. 1. The tiled display of FIG. 10 is substantially identical to the tiled displays of FIGS. 4 and 7 except for coupling relationship between first and second display devices; and, therefore, the redundant description will be omitted for ease in explanation of this figure.

Referring to FIG. 10, the tiled display TD may include a display area DA of the first display device 10-1, a display area DA of the second display device 10-2, and a seam SM between the display areas DA of the first and second display devices 10-1 and 10-2.

Each of the display devices 10-1 and 10-2 may include the first base part SUB1, the first support layer PI1, the display layer DPL, the second support layer PI2, and the second base part SUB2.

The first base part SUB1 of the first display device 10-1 may be disposed in the display area DA. The first base part SUB1 may support a surface of the first support layer PI1. For example, the first base part SUB1 may be, but is not limited to, a glass substrate including a glass material. The first base part SUB1 may support the display area DA and the non-display area NDA during the process of fabricating the first display device 10-1. The part of the first base part SUB1 corresponding to the seam SM may be removed before the first and second display devices 10-1 and 10-2 are coupled together. Accordingly, the first base part SUB1 of the first display device 10-1 may not be disposed in the seam SM. The side surface of the first base part SUB1 of the first display device 10-1 may be in contact with the side surface of the first base part SUB1 of the second display device 10-2 in the seam SM.

The first support layer PI1 may be disposed on the first base part SUB1 in the display area DA and the seam SM. The first support layer PI1 may support one surface of the display layer DPL. For example, the first support layer PI1 may include, but is not limited to, polyimide (PI). The side surface of the first support layer PI1 of the first display device 10-1 may be in contact with the side surface of the second base part SUB2 of the second display device 10-2.

The display layer DPL may be disposed on the first support layer PI1 in the display area DA and the seam SM. The display layer DPL may include the thin-film transistor layer TFTL, the light emitting element layer EML, the filler layer FIL, the sealing member AM, the wavelength conversion layer WLCL, and the color filter layer CFL. Optionally, the side surface of the display layer DPL of the first display device 10-1 may be in contact with the side surface of the second base part SUB2 of the second display device 10-2.

The second support layer PI2 may be disposed on the display layer DPL in the display area DA and the seam SM. The second support layer PI2 may be disposed on the surface of the second base part SUB2 to support the opposite surface of the display layer DPL. For example, the second support layer PI2 may include, but is not limited to, polyimide (PI). The side surface of the second support layer PI2 of the first display device 10-1 may be in contact with the side surface of the second base part SUB2 of the second display device 10-2.

The second base part SUB2 may be disposed on the second support layer PI2 in the display area DA and the seam SM. The second base part SUB2 may support the opposite surface of the second support layer PI2. For example, the second base part SUB2 may be, but is not limited to, a glass substrate including a glass material. The second base part SUB2 may support the display area DA of the first display device 10-1 and the seam SM. The side surface of the second base part SUB2 of the first display device 10-1 may be in contact with the side surface of the second base part SUB2 of the second display device 10-2. The second base part SUB2 of the first display device 10-1 and the first base part SUB1 of the second display device 10-2 may overlap each other in the thickness direction (or the z-axis direction) in the seam SM.

The tiled display TD may further include an adhesive film AF. The adhesive film AF may attach the lower surface of the first support layer PI1 of the first display device 10-1 to the upper surface of the second support layer PI2 of the second display device 10-2 in the seam SM. For example, the adhesive film AF may include an adhesive applied on either side, so that the first and second display devices 10-1 and 10-2 may be coupled with each other. Accordingly, the non-display areas NDA of the first and second display devices 10-1 and 10-2 adjacent to each other may overlap each other in the thickness direction (or the z-axis direction) in the seam SM.

The first base part SUB1 of the second display device 10-2 may be disposed in the display area DA and the seam SM. The first base part SUB1 may support a surface of the first support layer PI1. For example, the first base part SUB1 may be, but is not limited to, a glass substrate including a glass material. The first base part SUB1 may support the display area DA and the non-display area NDA of the second display device 10-2. The side surface of the first base part SUB1 of the second display device 10-2 may be in contact with the side surface of the first base part SUB1 of the first display device 10-1. The first base part SUB1 of the second display device 10-2 and the second base part SUB2 of the first display device 10-1 may overlap each other in the thickness direction (or the z-axis direction) in the seam SM.

The first support layer PI1 may be disposed on the first base part SUB1 in the display area DA and the seam SM. The first support layer PI1 may support one surface of the display layer DPL. For example, the first support layer PI1 may include, but is not limited to, polyimide (PI). The side surface of the first support layer PI1 of the second display device 10-2 may be in contact with the side surface of the first base part SUB1 of the first display device 10-1.

The display layer DPL may be disposed on the first support layer PI1 in the display area DA and the seam SM.

The display layer DPL may include the thin-film transistor layer TFTL, the light emitting element layer EML, the filler layer FIL, the sealing member AM, the wavelength conversion layer WLCL, and the color filter layer CFL. Optionally, the side surface of the display layer DPL of the second display device 10-2 may be in contact with the side surface of the first base part SUB1 of the first display device 10-1.

The second support layer PI2 may be disposed on the display layer DPL in the display area DA and the seam SM. The second support layer PI2 may be disposed on the surface of the second base part SUB2 to support the opposite surface of the display layer DPL. For example, the second support layer PI2 may include, but is not limited to, polyimide (PI). The side surface of the second support layer PI2 of the second display device 10-2 may be in contact with the side surface of the first base part SUB1 of the first display device 10-1.

The second base part SUB2 may be disposed on the second support layer PI2 in the display area DA. The second base part SUB2 may support the opposite surface of the second support layer PI2. For example, the second base part SUB2 may be, but is not limited to, a glass substrate including a glass material. The second base part SUB2 of the second display device 10-2 may support the display area DA and the non-display area NDA during the process of fabricating the second display device 10-2. The part of the second base part SUB2 corresponding to the seam SM may be removed before the first and second display devices 10-1 and 10-2 are coupled together. Accordingly, the second base part SUB2 of the second display device 10-2 may not be disposed in the seam SM. The side surface of the second base part SUB2 of the second display device 10-2 may be in contact with the side surface of the second base part SUB2 of the first display device 10-1 in the seam SM.

The thickness of each of the first and second base parts SUB1 and SUB2 may be larger than the thickness of the display layer DPL. For example, the thickness of each of the first and second base parts SUB1 and SUB2 may be multiple times the thickness of the display layer DPL, but the embodiment described herein is not limited thereto. Each of the first and second display devices 10-1 and 10-2 includes first and second base parts SUB1 and SUB2 having a predetermined thickness, so that the first and second display devices 10-1 and 10-2 can be supported stably as they are coupled together.

The non-display areas NDA of the first and second display devices 10-1 and 10-2 may overlap each other in the thickness direction (or the z-axis direction) in a single seam SM. Accordingly, the display areas DA of the plurality of display devices 10 may be so close to each other that the seams SM therebetween are not recognized by a viewer. The reflectance of external light at the display areas DA of the plurality of display devices 10 may be substantially equal to the reflectance of external light at the seams SM between the display devices 10. Accordingly, it is possible to prevent the seams SM between the display devices 10 of the tiled display TD from being recognized by a viewer, thereby eliminating visible seams and allowing the viewer to get immersed into the displayed images.

Figure 11:
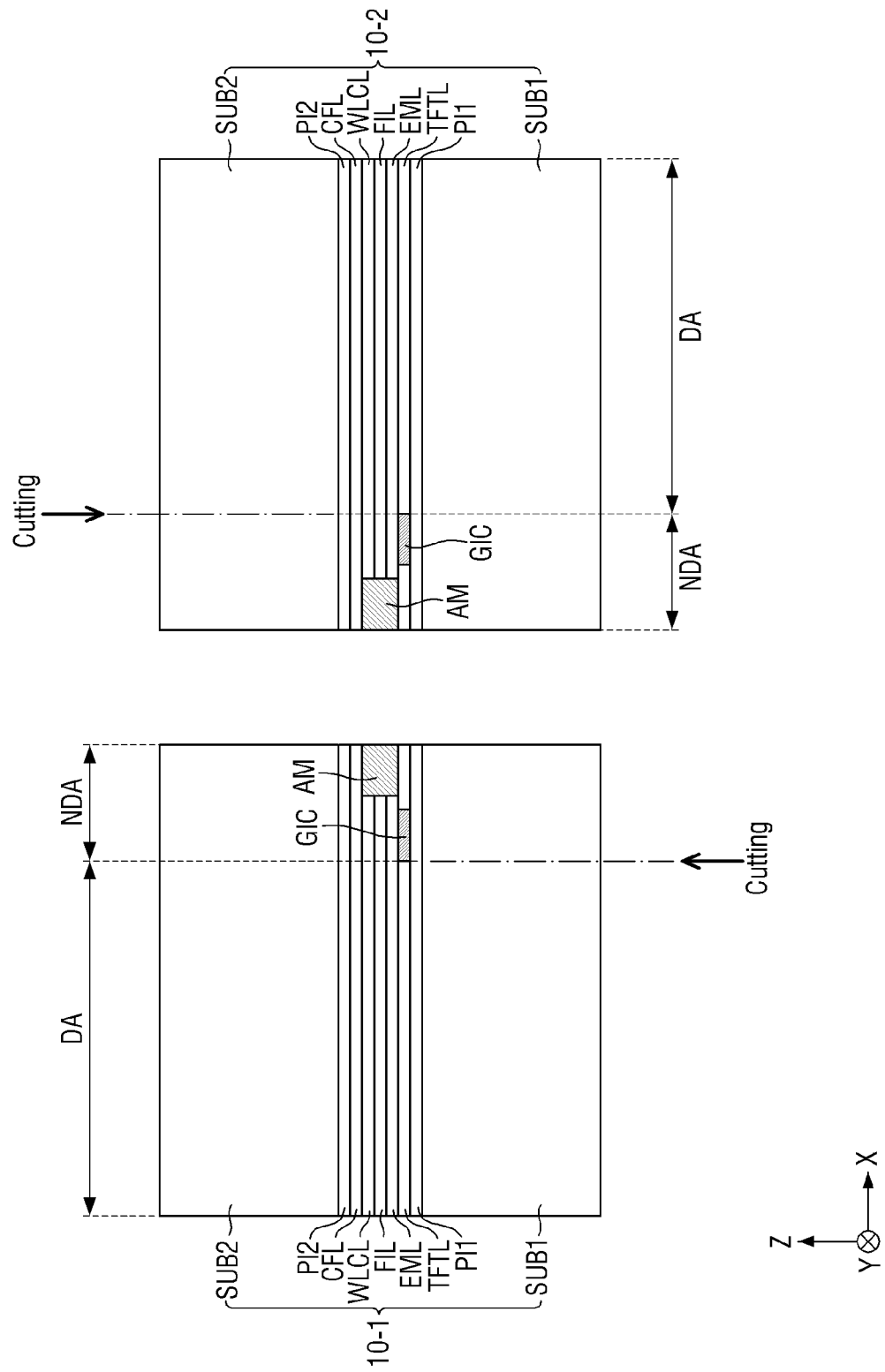
FIGS. 11 and 12 are cross-sectional views showing processes of fabricating the tiled display of FIG. 10.
Figure 12:
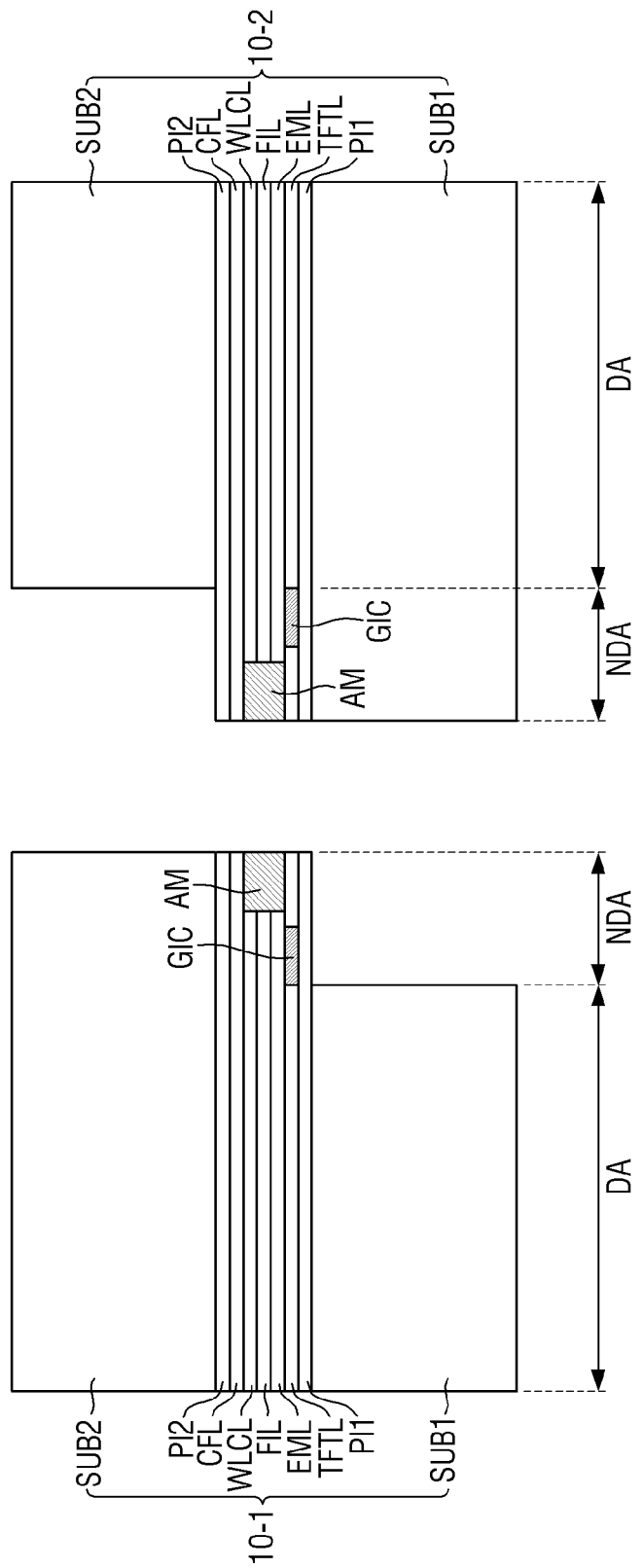

FIGS. 11 and 12 are cross-sectional views showing processes of fabricating the tiled display of FIG. 10.

In the example shown in FIG. 11, each of the display devices 10-1 and 10-2 may include the first base part SUB1, the first support layer PI1, the display layer DPL, the second support layer PI2, and the second base part SUB2.

The first support layer PI1, the thin-film transistor layer TFTL and the light emitting element layer EML may be sequentially stacked on the first base part SUB1. The first base part SUB1 may support the display area DA and the non-display area NDA during the process of fabricating the first and second display devices 10-1 and 10-2.

The second support layer PI2, the color filter layer CFL and the wavelength conversion layer WLCL may be sequentially stacked on the second base part SUB2. The second base part SUB2 may support the display area DA and the non-display area NDA during the process of fabricating the first and second display devices 10-1 and 10-2.

The first base part SUB1 and the second base part SUB2 may be attached together by the sealing member AM. The filler FIL may be used to fill between the light emitting element layer EML on the first base part SUB1 and the wavelength conversion layer WLCL on the second base part SUB2. The sealing member AM may be disposed along the first base part SUB1 and the second base part SUB2 in the non-display area NDA to seal the filler FIL.

In FIG. 12, after the first and second base parts SUB1 and SUB2 are attached together, the part of the first base part SUB1 of the first display device 10-1 corresponding to the seam SM may be removed, and the part of the second base part SUB2 of the second display device 10-2 corresponding to the seam SM may be removed. The process of removing the part of the first base part SUB1 of the first display device 10-2 and the part of the second base part SUB2 of the second display device 10-2 may include, but is not limited to, a cutting process.

The non-display areas NDA of the first and second display devices 10-1 and 10-2 adjacent to each other may overlap each other in the thickness direction (or the z-axis direction) in the seam SM. The lower surface of the first support layer PI1 of the first display device 10-1 may be attached to the upper surface of the second support layer PI2 of the second display device 10-2 by an adhesive film AF.

Figure 13:
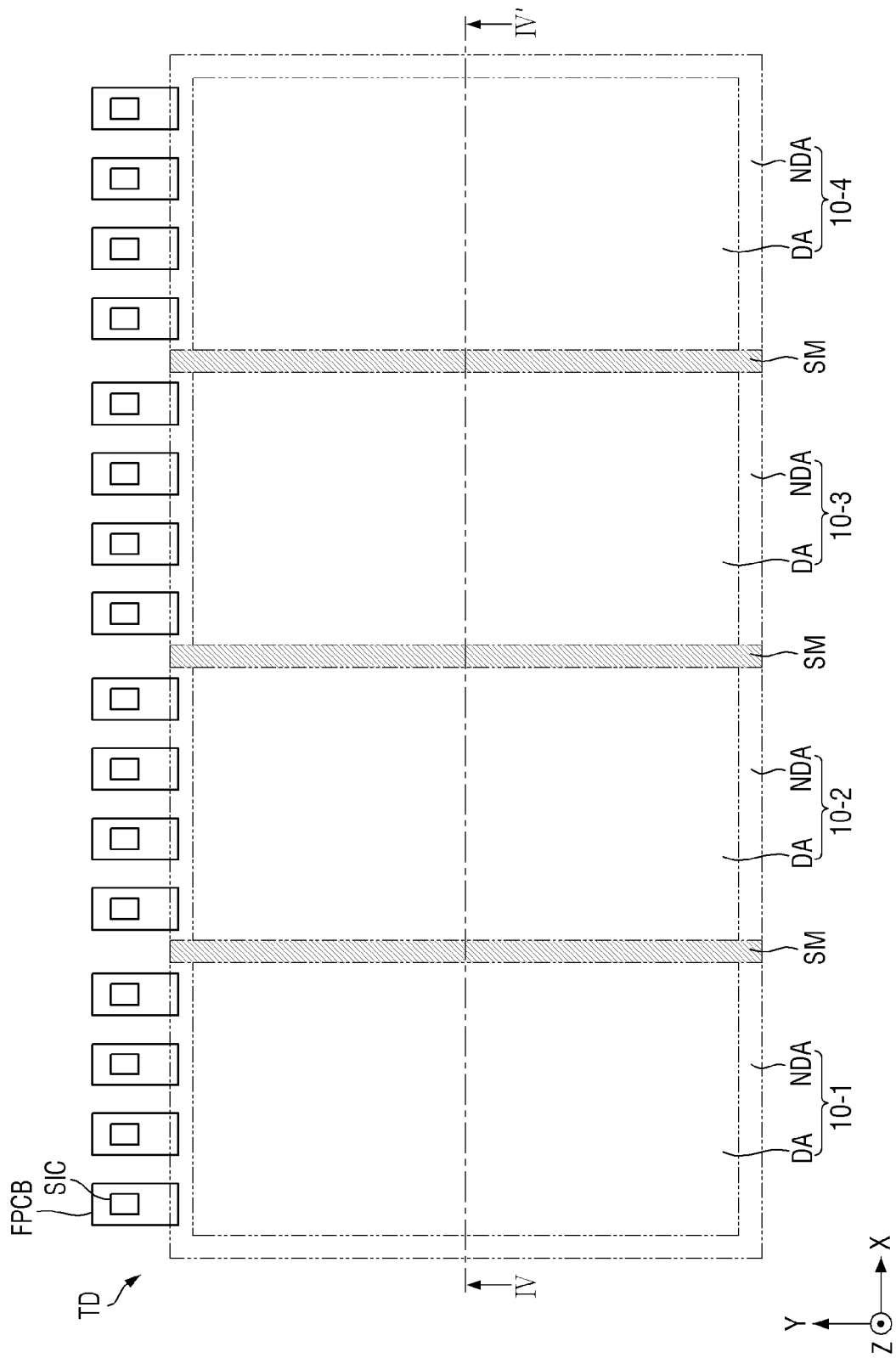
FIG. 13 is a plan view showing a tiled display according to another embodiment.

FIG. 13 is a plan view showing a tiled display according to another embodiment. The tiled display of FIG. 13 is substantially identical to the tiled display of FIG. 1 except for coupling relationship between first to fourth display devices 10-1, 10-2, 10-3 and 10-4; and, therefore, the redundant description will be omitted for ease in explanation of this figure.

Referring to FIG. 13, a tiled display TD may include a plurality of display devices 10. The plurality of display devices 10 may be connected in the first direction (x-axis direction), but the embodiment described herein is not limited thereto. For example, the plurality of display devices 10 may all have the same size. It is, however, to be understood that the embodiment described herein is not limited thereto. For another example, the display devices 10 may have different sizes.

Each of the plurality of display devices 10 may have a rectangular shape including longer sides and shorter sides. The display devices 10 may be arranged such that their longer sides are connected with one another. Some of the display devices 10 may be disposed in the center of the tiled display TD in the first direction (x-axis direction), and some others of the display devices 10 may be disposed on a side and the opposite as of the tiled display TD in the first direction (x-axis direction).

Each of the display devices 10 may include a display area DA and a non-display area NDA. The display area DA may include a plurality of pixels to display images. The non-display area NDA may be disposed around the display area DA to surround the display area DA, and may display no image.

The tiled display TD may include seams SM located between the plurality of display areas DA. The tiled display TD may be formed by connecting non-display areas NDA of the adjacent display devices 10 with one another. The plurality of display devices 10 may be connected with one another through coupling members or adhesive members. The non-display areas NDA of the adjacent display devices 10 may overlap each other in the thickness direction (or the z-axis direction) in a single seam SM. Accordingly, the display areas DA of the plurality of display devices 10 may be so close to each other that the seams SM therebetween are not recognized by a viewer. The reflectance of external light at the display areas DA of the plurality of display devices 10 may be substantially equal to the reflectance of external light at the seams SM between the display devices 10. Accordingly, it is possible to prevent the seams SM between the display devices 10 of the tiled display TD from being recognized by a viewer, thereby eliminating visible seams and allowing the viewer to get immersed into the displayed images without having to view unsightly seams between portions of an image being displayed.

The tiled display TD may include first to fourth display devices 10-1 to 10-4. The number and coupling relationship of the display devices 10 are not limited by the embodiment of FIG. 13. The number of the display devices 10 may be determined depending on the sizes of the display devices 10 and the tiled display TD.

Flexible films FPCB may be disposed in the non-display area NDA of each of the display devices 10. The flexible films FPCB may be attached to pads disposed on a base part of each of the plurality of display devices 10. One sides of the flexible films FPCB may be connected to the pads, while the other sides of the flexible films FPCB may be connected to source circuit boards (not shown). The flexible films FPCB may transmit signals from source drivers SIC to the display devices 10.

The flexible films FPCB may be disposed on the non-display areas NDA disposed along the edges of the tiled display TD. For example, the plurality of flexible films FPCB may be disposed on the upper side of the non-display area NDA of each of the first to fourth display devices 10-1 to 10-4, but the embodiment described herein is not limited thereto.

Figure 14:
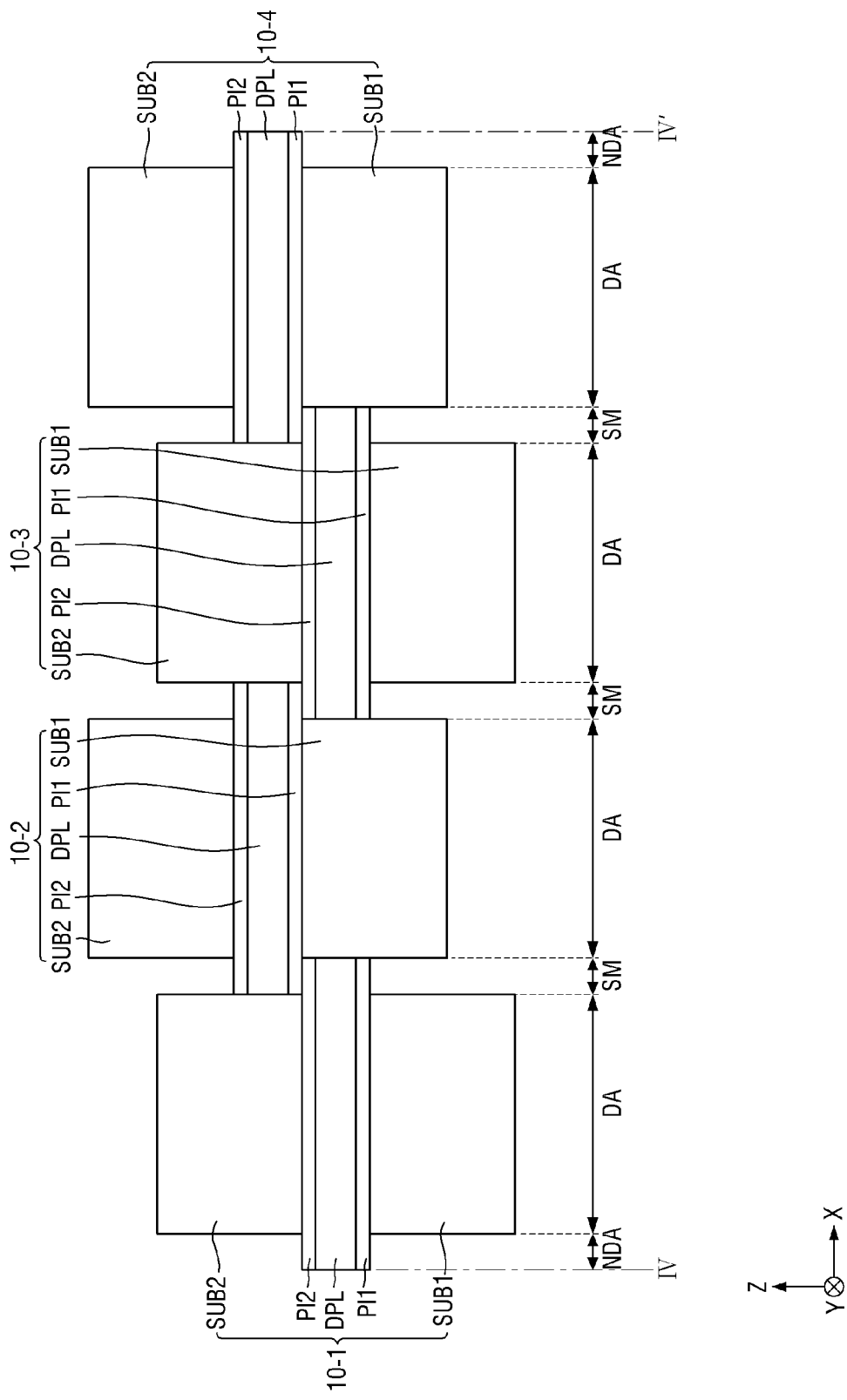
FIG. 14 is an example of a cross-sectional view taken along line IV-IV' of FIG. 13.

FIG. 14 is an example of a cross-sectional view taken along line IV-IV' of FIG. 13.

Referring to FIG. 14, the tiled display TD may include display areas DA of the first to fourth display device 10-1 to 10-4, and seams SM between the display areas DA.

Each of the display devices 10-1 to 10-4 may include the first base part SUB1, the first support layer PI1, the display layer DPL, the second support layer PI2, and the second base part SUB2. The first and second base parts SUB1 and SUB2 may support the display areas DA and the non-display areas NDA during the process of fabricating the display devices 10. The parts of the first and second base parts SUB1 and SUB2 corresponding to the seams SM may be removed before the first to fourth display devices 10-1 to 10-4 are coupled together. As a result, the first and second base parts SUB1 and SUB2 may not be disposed in the seam SM.

The first base part SUB1 of the first display device 10-1 may be spaced apart from the first base part SUB1 of the second display device 10-2 with the seam SM therebetween. The second base part SUB2 of the first display device 10-1 may be spaced apart from the second base part SUB2 of the second display device 10-2 with the seam SM therebetween.

The upper surface of the second support layer PI2 of the first display device 10-1 may be coupled with the lower surface of the first support layer PI1 of the second display device 10-2 in the seam SM. The side surface of the first support layer PI1 and second support layer PI2 of the first display device 10-1 may be in contact with the side surface of the first base part SUB1 of the second display device 10-2. The side surface of the first support layer PI1 and the side surface of the second support layer PI2 of the second display device 10-2 may be in contact with the side surface of the second base part SUB2 of the first display device 10-1.

The lower surface of the first support layer PI1 of the second display device 10-2 may be coupled with the upper surface of the second support layer PI2 of the third display device 10-3 in the seam SM. The upper surface of the second support layer PI2 of the third display device 10-3 may be coupled with the lower surface of the first support layer PI1 of the fourth display device 10-4 in the seam SM.

Figure 15:
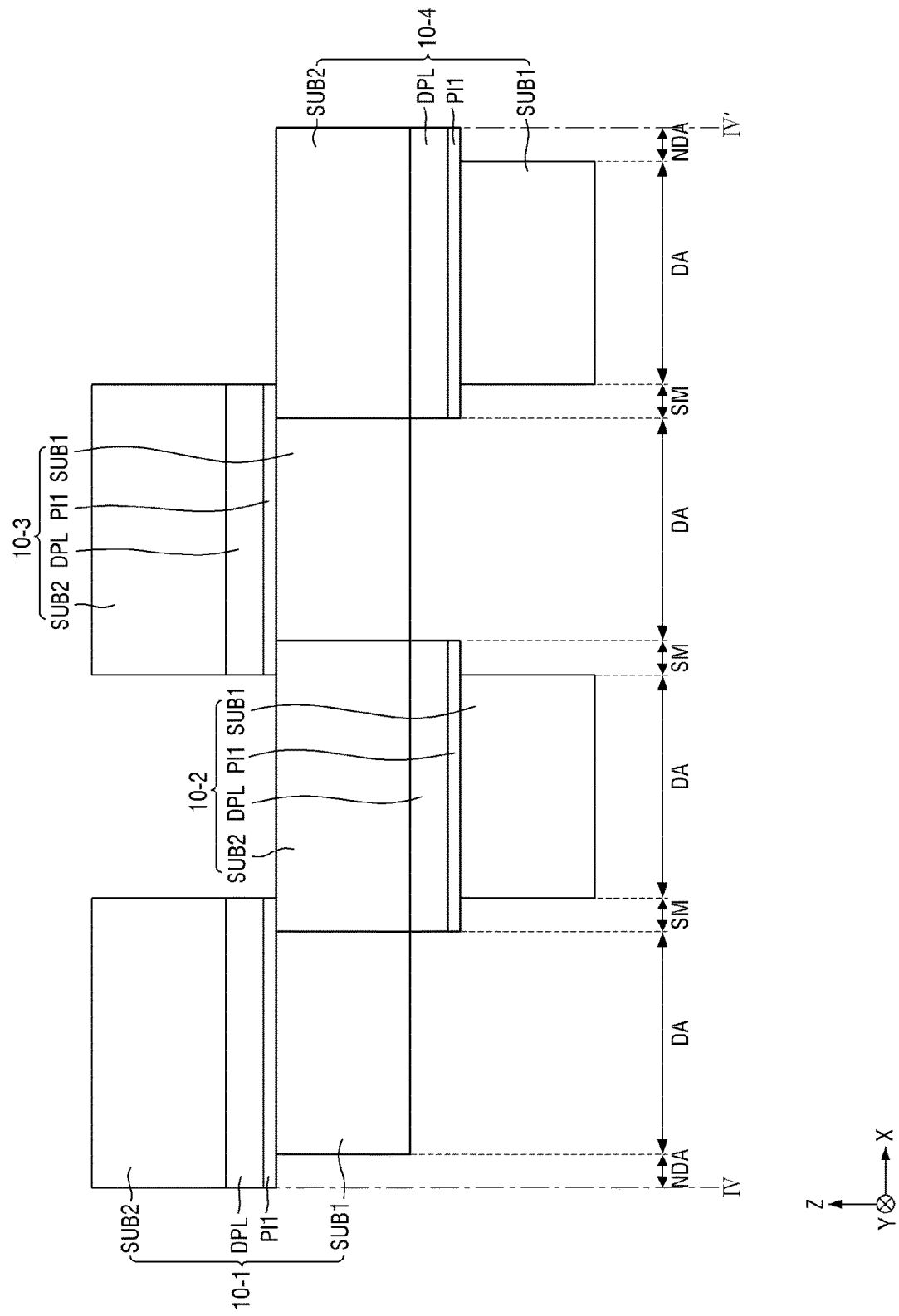
FIG. 15 is another example of a cross-sectional view taken along line IV-IV' of FIG. 13.

FIG. 15 is another example of a cross-sectional view taken along line IV-IV' of FIG. 13.

Referring to FIG. 15, the tiled display TD may include display areas DA of the first to fourth display device 10-1 to 10-4, and seams SM between the display areas DA.

Each of the display devices 10-1 to 10-4 may include the first base part SUB1, the first support layer PI1, the display layer DPL, and the second base part SUB2.

The first base part SUB1 may be disposed in the display area DA but not in the seam SM. The first base part SUB1 may support the display areas DA and the non-display areas NDA during the process of fabricating the display devices 10. The part of the first base part SUB1 corresponding to the seam SM may be removed before the first to fourth display devices 10-1 to 10-4 are coupled together.

The second base part SUB2 may be disposed in the display area DA and the seam SM to support the display area DA and the seam SM. Since the opposite surface of the display layer DPL in the display device 10 is supported by the second base part SUB2, no additional support layer is required between the second base part SUB2 and the display layer DPL. The second base parts SUB2 of the display devices 10 adjacent to each other may overlap each other in the thickness direction (or the z-axis direction) in the seams SM. The second base parts SUB2 of the first and second display devices 10-1 and 10-2 may overlap each other in the thickness direction (or the z-axis direction) in the seam SM.

The lower surface of the first support layer PI1 of the first display device 10-1 may be coupled with the upper surface of the second base part SUB2 of the second display device 10-2 in the seam SM. The side surface of the first base part SUB1 of the first display device 10-1 may be in contact with the side surface of the second base part SUB2 of the second display device 10-2 in the seam SM.

The upper surface of the second base part SUB2 of the second display device 10-2 may be coupled with the lower surface of the first support layer PI1 of the third display device 10-2 in the seam SM. The side surface of the second base part SUB2 of the second display device 10-2 may be in contact with the side surface of the first base part SUB1 of the third display device 10-3.

The lower surface of the first support layer PI1 of the third display device 10-3 may be coupled with the upper surface of the second base part SUB2 of the second display device 10-2 in the seam SM. The side surface of the first base part SUB1 of the third display device 10-3 may be in contact with the side surface of the second base part SUB2 of the fourth display device 10-4 in the seam SM.

Figure 16:
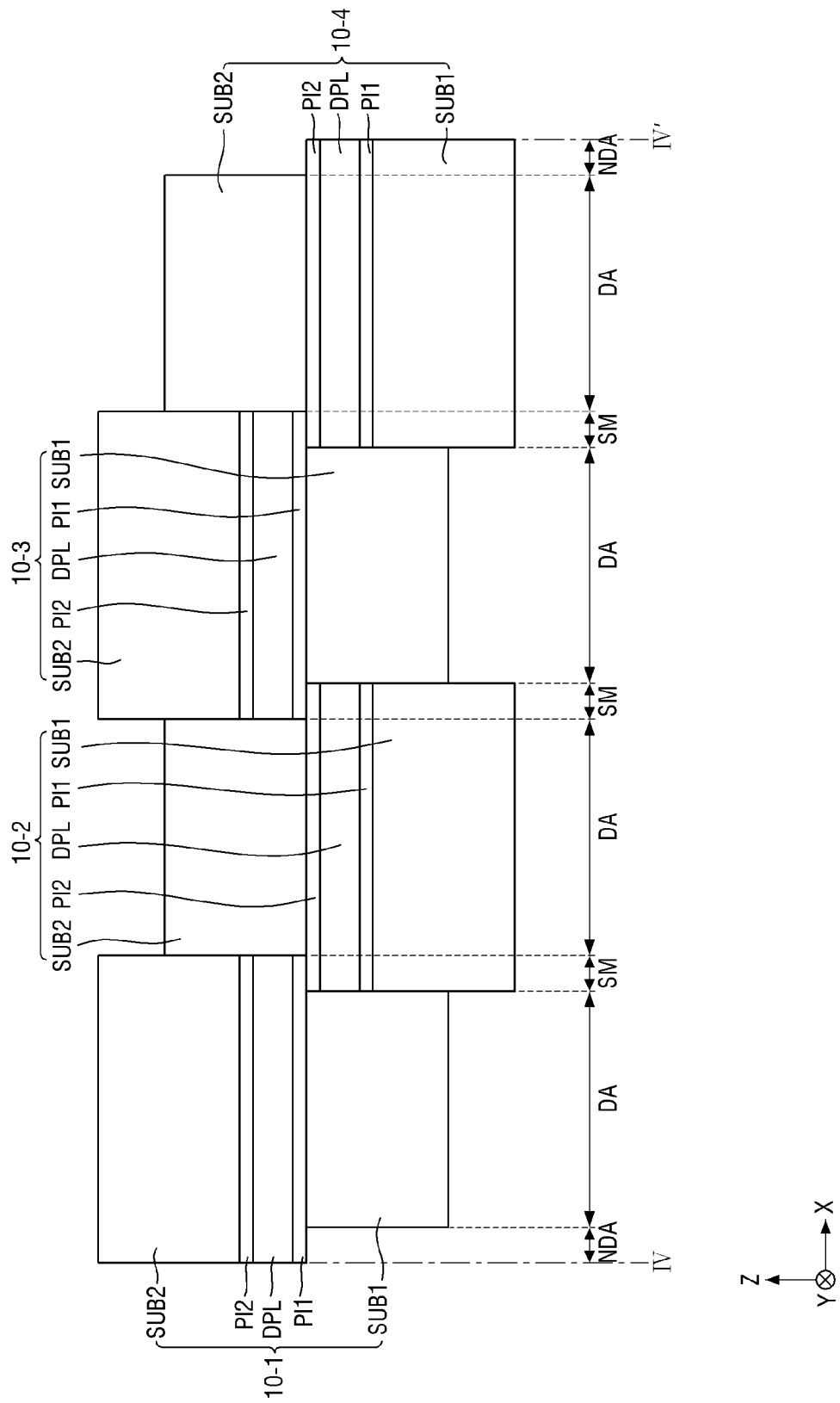
FIG. 16 is yet another example of a cross-sectional view taken along line IV-IV' of FIG. 13.

FIG. 16 is yet another example of a cross-sectional view taken along line IV-IV' of FIG. 13.

Referring to FIG. 16, the tiled display TD may include display areas DA of the first to fourth display device 10-1 to 10-4, and seams SM between the display areas DA.

Each of the display devices 10-1 to 10-4 may include the first base part SUB1, the first support layer PI1, the display layer DPL, the second support layer PI2, and the second base part SUB2.

The first base part SUB1 of the first display device 10-1 may support the display area DA and the non-display area NDA during the process of fabricating the first display device 10-1. The part of the first base part SUB1 corresponding to the seam SM may be removed before the first and second display devices 10-1 and 10-2 are coupled together. Accordingly, the first base part SUB1 of the first display device 10-1 may not be disposed in the seam SM.

The second base part SUB2 of the first display device 10-1 may be disposed in the display area DA and the seam SM to support the display area DA and the seam SM. The side surface of the second base part SUB2 of the first display device 10-1 may be in contact with the side surface of the second base part SUB2 of the second display device 10-2. The second base part SUB2 of the first display device 10-1 and the first base part SUB1 of the second display device 10-2 may overlap each other in the thickness direction (or the z-axis direction) in the seam SM.

The first base part SUB1 of the second display device 10-2 may be disposed in the display area DA and the seam SM to support the display area DA and the seam SM. The side surface of the first base part SUB1 of the second display device 10-2 may be in contact with the side surface of the first base part SUB1 of the first display device 10-1. The first base part SUB1 of the second display device 10-2 and the second base part SUB2 of the first display device 10-1 may overlap each other in the thickness direction (or the z-axis direction) in the seam SM.

The second base part SUB2 of the second display device 10-2 may support the display area DA and the non-display area NDA during the process of fabricating the second display device 10-2. The part of the second base part SUB2 corresponding to the seam SM may be removed before the first and second display devices 10-1 and 10-2 are coupled together. Accordingly, the second base part SUB2 of the second display device 10-2 may not be disposed in the seam SM.

The lower surface of the first support layer PI1 of the first display device 10-1 may be coupled with the upper surface of the second support layer PI2 of the second display device 10-2 in the seam SM. The side surface of the first support layer PI1 and the side surface of the second support layer PI2 of the first display device 10-1 may be in contact with the side surface of the second base part SUB2 of the second display device 10-2. The side surface of the first support layer PI1 and the side surface of the second support layer PI2 of the second display device 10-1 may be in contact with the side surface of the first base part SUB1 of the first display device 10-1.

The upper surface of the second support layer PI2 of the second display device 10-2 may be coupled with the lower surface of the first support layer PI1 of the third display device 10-3 in the seam SM. The lower surface of the first support layer PI1 of the third display device 10-3 may be coupled with the upper surface of the second support layer PI2 of the fourth display device 10-4 in the seam SM.

Although certain embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A tiled display comprising:
   first and second display devices disposed adjacent to each other, the first and second display devices each comprising a display area having light-emitting areas, and a seam between adjacent ones of the display areas,
   wherein each of the first and second display devices comprises:
   a first base part in the display area;
   a first support layer on the first base part in the display area and the seam;
   a display layer on the first support layer in the display area and the seam;
   a second support layer on the display layer in the display area and the seam; and
   a second base part on the second support layer in the display area,
   a filler layer between the light emitting element layer and the wavelength conversion layer; and
   a first sealing member in the seam and surrounding the filler layer on a planar surface;
   a first gate driver in the seam;
   a second sealing member in the seam; and
   a second gate driver in the seam; and
   wherein the first support layer of the second display device is disposed on the second support layer of the first display device in the seam.

2. The tiled display of claim 1, further comprising:
   an adhesive film attaching a lower surface of the first support layer of the second display device to an upper surface of the second support layer of the first display device in the seam.

3. The tiled display of claim 1, wherein a side surface of the first support layer or a side surface of the second support layer of the first display device is in contact with a side surface of the first base part of the second display device.

4. The tiled display of claim 1, wherein a side surface of the first support layer or a side surface of the second support layer of the second display device is in contact with a side surface of the second base part of the first display device.

5. The tiled display of claim 1, wherein the display layer comprises:
   a thin-film transistor layer on the first support layer and comprising a plurality of thin-film transistors;
   a light emitting element layer on the thin-film transistor layer and comprising a plurality of light-emitting elements;
   a wavelength conversion layer on the light emitting element layer and comprising wavelength-converting units corresponding to the light-emitting areas, respectively; and
   a color filter layer on the wavelength conversion layer and comprising color filters corresponding to the light-emitting areas, respectively.

6. The tiled display of claim 5, wherein the first sealing member of the first display device faces a side surface of the first base part of the second display device, and wherein the first sealing member of the second display device faces a side surface of the second base part of the first display device.

7. The tiled display of claim 5, wherein the display layer is disposed on the thin-film transistor layer in the seam, and wherein the tiled display further comprises a gate driver electrically connected to the plurality of thin-film transistors in the display areas.

8. The tiled display of claim 1, wherein each of the first and second base parts comprises a glass material, and wherein each of the first and second support layers comprise polyimide (PI).

9. The display device of claim 1, wherein a thickness of the first base part or the second base part is greater than a thickness of the display layer.

* * * * *